(12) United States Patent
Hiroki

(10) Patent No.: US 11,004,664 B2
(45) Date of Patent: May 11, 2021

(54) HEAT TRANSFER MEDIUM SUPPLY SYSTEM AND SUBSTRATE PROCESSING APPARATUS

(71) Applicant: TOKYO ELECTRON LIMITED, Tokyo (JP)

(72) Inventor: Tsutomu Hiroki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 640 days.

(21) Appl. No.: 15/806,858

(22) Filed: Nov. 8, 2017

(65) Prior Publication Data
US 2018/0130645 A1 May 10, 2018

(30) Foreign Application Priority Data
Nov. 8, 2016 (JP) .............................. JP2016-217855

(51) Int. Cl.
*H01J 37/32* (2006.01)
*H01L 21/683* (2006.01)
*F28D 7/00* (2006.01)
*F28D 7/12* (2006.01)
(Continued)

(52) U.S. Cl.
CPC ...... *H01J 37/32724* (2013.01); *F28D 7/0066* (2013.01); *F28D 7/12* (2013.01); *F28F 27/02* (2013.01); *H01J 37/32091* (2013.01); *H01L 21/67103* (2013.01); *H01L 21/67109* (2013.01); *H01L 21/67248* (2013.01); *H01L 21/6831* (2013.01); *H01L 21/6833* (2013.01); *H01J 37/32467* (2013.01); *H01J 37/32495* (2013.01)

(58) Field of Classification Search
CPC ........ F28D 7/0066; F28D 7/0075; F28D 7/12; F28F 27/02; F16K 11/0856; H01J 37/32091; H01J 37/32467; H01J 37/32495; H01J 37/32724; H01J 37/32734; H01L 21/67103; H01L 21/6833
See application file for complete search history.

(56) References Cited

U.S. PATENT DOCUMENTS 1,571,810 A * 2/1926 Shimp
3,918,494 A * 11/1975 Dalton
4,986,307 A * 1/1991 Hardee
(Continued)

FOREIGN PATENT DOCUMENTS

| JP | 2016-012593 | 1/2016 |
| JP | 2016-081158 | 5/2016 |

*Primary Examiner* — Karla A Moore
*Assistant Examiner* — Margaret D Klunk
(74) *Attorney, Agent, or Firm* — Fenwick & West LLP

(57) ABSTRACT

A heat transfer medium supply system includes valve units each alternately supplying a first and a second heat transfer medium to a corresponding zone of a stage. The valve unit includes a housing and a shaft. The housing has first and second inlets, and first and second outlets. The first and second inlets are respectively connected to a first and a second medium temperature controller. The first and second outlets are connected to the corresponding zone. The shaft is inserted in the housing and has first and second supply grooves. The first supply groove connects the first inlet to the first outlet when a rotation angle about a central axis of the shaft is within a first angle range, and the second supply groove connects the second inlet to the second outlet when the rotation angle about the central axis of the shaft is within a second angle range.

14 Claims, 18 Drawing Sheets

(51) Int. Cl.
*F28F 27/02* (2006.01)
*H01L 21/67* (2006.01)

(56) References Cited

U.S. PATENT DOCUMENTS

| | | | |
|---|---|---|---|
| 5,437,304 A * | 8/1995 | Delcroix | |
| 2012/0132397 A1* | 5/2012 | Silveira | |
| 2015/0377571 A1 | 12/2015 | Hiroki | |
| 2016/0104605 A1 | 4/2016 | Hiroki | |

\* cited by examiner

HEAT TRANSFER MEDIUM SUPPLY SYSTEM AND SUBSTRATE PROCESSING APPARATUS

CROSS-REFERENCE TO RELATED APPLICATIONS

This application claims priority to Japanese Patent Application No. 2016-217855 filed on Nov. 8, 2016, the entire contents of which are incorporated herein by reference.

FIELD OF THE INVENTION

The disclosure relates to a heat transfer medium supply system and a plasma processing apparatus.

BACKGROUND OF THE INVENTION

A substrate processing apparatus is used in manufacturing electronic devices such as semiconductor devices and the like. The substrate processing apparatus generally includes a chamber main body and a stage. The stage is provided in the chamber main body and configured to hold a substrate mounted thereon.

In the case of processing a substrate by using the substrate processing apparatus, a processing gas is supplied into the chamber main body and the substrate mounted on the stage is processed by the processing gas. When the substrate is processed, a temperature of the substrate needs to be controlled. In order to control the temperature of the substrate, the substrate processing apparatus may be configured to supply a heat transfer medium to the stage.

Such a substrate processing apparatus is disclosed in Japanese Patent Application Publication Nos. 2016-12593 and 2016-81158.

In the substrate processing apparatuses disclosed in Japanese Patent Application Publication Nos. 2016-12593 and 2016-81158, a first heat transfer medium and a second heat transfer medium having a temperature different from that of the first heat transfer medium are alternately supplied to a plurality of zones of the stage. In this substrate processing apparatus, the temperature of the substrate is controlled by controlling a period of time in which the first heat transfer medium is supplied to the stage and a period of time in which the second heat transfer medium is supplied to the stage.

Each of the substrate processing apparatuses disclosed in Japanese Patent Application Publication Nos. 2016-12593 and 2016-81158 includes two three-way valves and two opening/closing valves, i.e., four valve units, for a single zone. Therefore, the number of the valve units in the substrate processing apparatus can be obtained by multiplying the number (four) of the valve units for a single zone by the number of zones.

Since multiple valve units are required to alternately supply the first heat transfer medium and the second heat transfer medium to the stage as described above, it is required to reduce the size of the apparatus by decreasing the number of the valve units. Further, the high-speed operations of the opening/closing valves and the three-way valves are required to alternately supply the first heat transfer medium and the second heat transfer medium to the stage. Therefore, it is required to improve the operating speed and the durability of the valve units.

SUMMARY OF THE INVENTION

In accordance with an aspect, there is provided a supply system for alternately supplying a first heat transfer medium outputted from a first medium temperature controller and a second heat transfer medium outputted from a second medium temperature controller to one or more zones of a stage configured to support a substrate, a temperature of the first heat transfer medium being different from a temperature of the second heat transfer medium. The supply system includes a first supply line, a second supply line, one or more third supply lines, one or more fourth supply lines, and one or more valve units. The first supply line is connected to a supply port of the first medium temperature controller for outputting the first heat transfer medium. The second supply line is connected to a supply port of the second medium temperature controller for outputting the second heat transfer medium. The one or more third supply lines are configured to feed the first heat transfer medium from the first supply line to the one or more zones, respectively. The one or more fourth supply lines are configured to feed the second heat transfer medium from the second supply line to the one or more zones, respectively. Each of the one or more valve units is configured to alternately supply the first heat transfer medium and the second heat transfer medium to a corresponding zone among the one or more zones. Each of the one or more valve units includes a tubular housing, a shaft body and a driving unit. The housing has a first inlet, a second inlet, a first outlet and a second outlet. The first inlet is connected to the first supply line, the second inlet is connected to the second supply line, the first outlet is connected to one of the one or more third supply lines configured to feed the first heat transfer medium to the corresponding zone, and the second outlet is connected to one of the one or more fourth supply lines configured to feed the second heat transfer medium to the corresponding zone. The shaft body is inserted in the housing and has a first supply groove and a second supply groove which extend along a circumferential direction around the central axis of the shaft body. The first supply groove connects the first inlet to the first outlet when a rotation angle about a central axis of the shaft body is within a first angle range and the second supply groove connects the second inlet to the second outlet when the rotation angle about the central axis of the shaft body is within a second angle range. The driving unit is configured to rotate the shaft body about the central axis.

In accordance with another aspect, there is provided a substrate processing apparatus for processing a substrate. The substrate processing apparatus includes a chamber main body, a stage and the supply system described above. The stage is provided in the chamber main body and configured to hold a substrate, and has one or more zones. The supply system is configured to alternately supply the first heat transfer medium and the second heat transfer medium to said one or more zones.

In accordance with still another aspect, there is provided a substrate processing apparatus for processing a substrate. The substrate processing apparatus includes a chamber main body, a stage and the supply system described above. The stage is provided in the chamber main body and configured to hold a substrate, and has a plurality of zones. The supply system is configured to alternately supply the first heat transfer medium and the second heat transfer medium to the plurality of zones.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
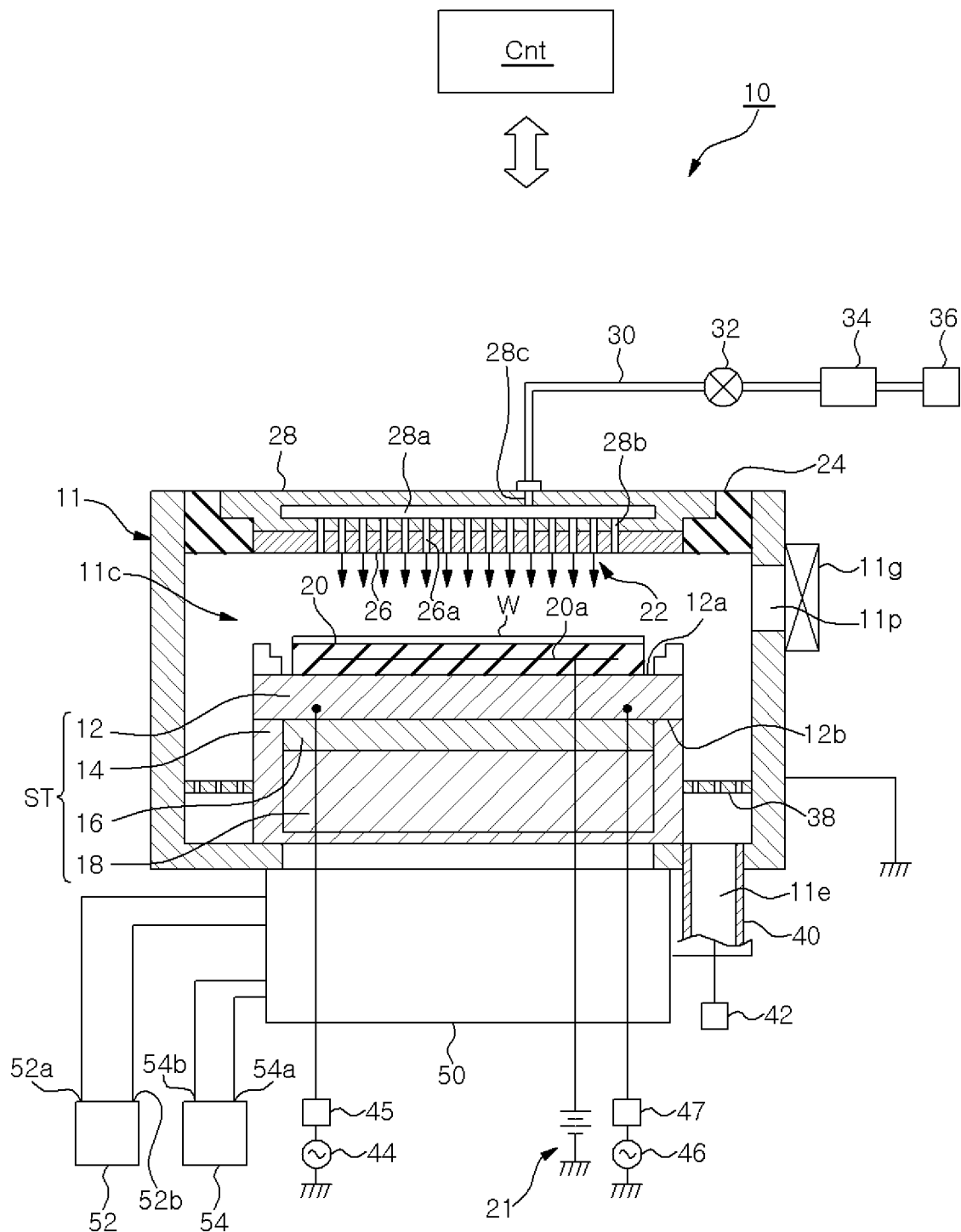
FIG. 1 schematically shows a substrate processing apparatus according to an embodiment.

Hereinafter, embodiments will be described in detail with reference to the accompanying drawings. Like reference numerals will be used for like or corresponding parts throughout the drawings.

First, a substrate processing apparatus according to an embodiment will be described. FIG. 1 schematically shows the substrate processing apparatus according to the embodiment. FIG. 1 shows a partially sectional view of the substrate processing apparatus according to the embodiment. A substrate processing apparatus 10 shown in FIG. 1 is a capacitively coupled plasma processing apparatus. The substrate processing apparatus 10 includes a chamber main body 11. The chamber main body 11 has a substantially cylindrical shape. An inner space of the chamber main body 11 serves as a chamber 11c. The chamber main body 11 is made of a metal such as aluminum. A plasma resistant film is formed on an inner surface of the chamber 11 which faces the chamber 11c. This film is made of aluminum oxide or yttrium oxide. The chamber main boy 11 is grounded.

A stage ST is provided on a bottom portion of the chamber main body 11. The stage ST is configured to hold a substrate W mounted thereon. Further, the stage ST is configured to control a temperature of the substrate W. The stage ST includes a plate 12, a case 14, a heat exchanger 16, a flow path unit 18 and an electrostatic chuck 20.

The plate 12 is a metallic member and has a substantially disc shape. The plate 12 is made of, e.g., aluminum. The plate 12 may be made of a different conductive material. The plate 12 has a top surface 12a and a bottom surface 12b.

The case 14 has a substantially cylindrical shape. An opening is formed at an upper end of the case 14. The case 14 is made of a metal, e.g., stainless steel. The plate 12 is provided on an upper end surface of the case 14. The heat exchanger 16 and the flow path unit 18 are accommodated in the case 14. The heat exchanger 16 is provided on the flow path unit 18. The plate 12 is provided on the heat exchanger 16. The plate 12, the case 14, the heat exchanger and the flow path unit 18 of the stage ST will be described in detail later.

The electrostatic chuck 20 is provided on the top surface 12a of the plate 12. The electrostatic chuck 20 is configured to hold the substrate W mounted thereon. The electrostatic chuck 20 includes a main body made of an insulator and an electrode 20a embedded in the main body. A DC power supply 21 is connected to the electrode 20a via a switch. When a voltage is applied from the DC power supply 21 to the electrode 20a, an electrostatic force is generated by the electrostatic chuck 20. The electrostatic chuck 20 holds the substrate W by attracting the substrate W toward the electrostatic chuck 20 by the electrostatic force.

The substrate processing apparatus 10 further includes an upper electrode 22. The upper electrode 22 is provided above the stage ST with a space in the chamber 11c therebetween. The upper electrode 22 is supported at an upper portion of the chamber main body 11 through a member 24. The upper electrode 22 may include an electrode plate 26 and a holding body 28. The electrode plate 26 faces the chamber 11c. A plurality of gas injection holes 26a is formed in the electrode plate 26. The electrode plate 26 may be made of a semiconductor or a conductor of low resistance having small Joule heat. In one embodiment, the electrode plate 26 is grounded. When the electrode plate 26 is grounded, the member 24 has conductivity and is grounded. When a high frequency power supply is connected to the upper electrode 22 as will be described later, an insulating member is used as the member 24.

The holding body 28 detachably holds the electrode plate 26. The holding body 28 may be made of a conductive material, e.g., aluminum. The holding body 28 may have a water cooling structure. A gas diffusion space 28a and a plurality of holes 28b are formed in the holding body 28. The holes 28b extend downward from the gas diffusion space 28a to communicate with the respective gas injection holes 26a. An inlet port 28c is formed at the holding body 28. The inlet port 28c is connected to the gas diffusion space 28a. A gas supply line 30 is connected to the inlet port 28c.

One or more gas sources 36 are connected to the gas supply line 30 via one or more valves 32 and one or more flow rate controllers 34. Each of the flow rate controllers 34 is a mass flow controller or a pressure control type flow rate controller. One or more gas sources 36 are gas sources of processing gases used for processing a substrate in the substrate processing apparatus 10. The processing gases from one or more gas sources 36 are injected to the chamber 11c through the gas supply line 30, the gas diffusion space 28a, the holes 28b and the gas injection holes 26a.

An opening 11p through which the substrate W is loaded into or unloaded from the chamber 11c is formed at a sidewall of the chamber main body 11. The opening 11p can be opened/closed by a gate valve 11g. A gas exhaust passage is formed between the sidewall of the chamber main body 11 and the stage ST. A baffle plate 38 is provided in the gas exhaust passage. A plurality of holes is formed through the baffle plate 38 in a plate thickness direction thereof.

At the bottom portion of the chamber main body 11, a gas exhaust port 11e is provided below the baffle plate 38. A gas exhaust unit 42 is connected to the gas exhaust port 11e through a gas exhaust line 40. The gas exhaust unit 42 includes a vacuum pump such as a pressure controller, a turbo molecular pump or the like.

The substrate processing apparatus 10 further includes a high frequency power supply 44, a matching unit 45, a high frequency power supply 46 and a matching unit 47. The high frequency power supply 44 is a power supply for outputting a high frequency power for plasma generation. A frequency of the high frequency power outputted by the high frequency power supply 44 is 27 MHz or above, e.g., 40 MHz. The high frequency power supply 44 is connected to the plate 12 via the matching unit 45. The high frequency power outputted by the high frequency power supply 44 is supplied to the plate 12 via the matching unit 45. The matching unit 45 includes a matching circuit for matching an impedance of a load side of the high frequency power supply 44 with an output impedance of the high frequency power supply 44. The high frequency power supply 44 may be connected to the upper electrode 22 via the matching unit 45.

The high frequency power supply 46 is a power supply for outputting a high frequency power for attracting ions to the substrate W. A frequency of the high frequency power outputted by the high frequency power supply 46 is 13.56 MHz or less, e.g., 3 MHz. The high frequency power supply 46 is connected to the plate 12 via the matching unit 47. The high frequency power outputted by the high frequency power supply 46 is supplied to the plate 12 via the matching unit 47. The matching unit 47 includes a matching circuit for matching an impedance of a load side of the high frequency power supply 46 with an output impedance of the high frequency power supply 46.

The substrate processing apparatus 10 further includes a heat transfer medium supply system 50. The supply system 50 alternately supplies a first heat transfer medium and a second heat transfer medium to one or more zones of the stage ST. The first heat transfer medium is supplied from a first medium temperature controller 52 to the stage ST through the supply system 50. The heat transfer medium returns to the first medium temperature controller 52 from the stage ST through the supply system 50. The first medium temperature controller 52 is configured to control a temperature of the outputted first heat transfer medium to a set temperature. The second heat transfer medium is supplied to the stage ST from the second medium temperature controller 54 through the supply system 50. The heat transfer medium returns to the second medium temperature controller 54 from the stage ST through the supply system 50. The second medium temperature controller 54 is configured to control a temperature of the outputted second heat transfer medium to another set temperature. The temperature of the first heat transfer medium is different from that of the second heat transfer medium.

In one embodiment, the substrate processing apparatus 10 further includes a control unit Cnt. The control unit Cnt may be a computer including a processor, a storage unit, an input device, a display device and the like. The control unit Cnt controls the respective components of the substrate processing apparatus 10, e.g., a power system, a gas supply system, a driving system and the like. The control unit Cnt is configured to control driving units of one or more valve units of the supply system 50 which will be described later. In the control unit Cnt, an operator can input commands or the like by using the input device to manage the substrate processing apparatus 10 and visualize and display an operational state of the substrate processing apparatus 10 by using the display device. The storage unit of the control unit Cnt stores a processing recipe and a control program for controlling various processes performed by the substrate processing apparatus 10 by the processor.

Figure 2:
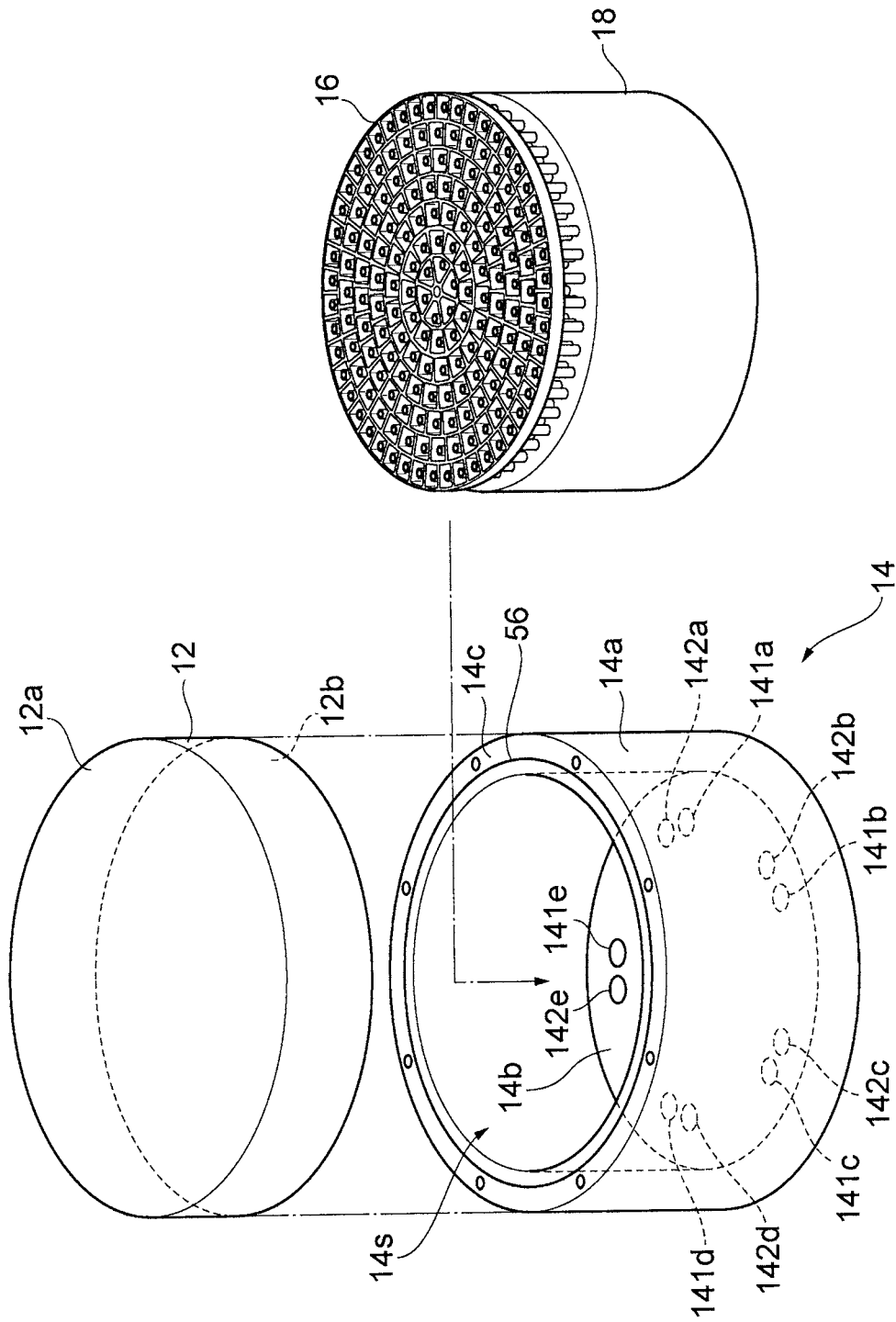
FIG. 2 is an exploded perspective view of a stage according to an embodiment.

Hereinafter, the plate 12, the case 14, the heat exchanger 16 and the flow path unit 18 of the stage ST will be described in detail. FIG. 2 is an exploded perspective view of the stage according to the embodiment. The case 14 includes a sidewall 14a and a bottom wall 14b. The case 14 defines an accommodating space 14s. The sidewall 14a has a cylindrical shape. The bottom wall 14b has a substantially disc shape and is connected to a lower end of the sidewall 14a. As described above, the plate 12 is provided on an upper end surface 14c of the sidewall 14a of the case 14. An O ring 56 is provided between the upper end surface 14c and the plate 12 to seal a space therebetween. The plate 12 is fixed to the case 14 by, e.g., screws, such that the O ring 56 is interposed between the plate 12 and the upper end surface 14c.

A plurality of first openings 141a, 141b, 141c, 141d and 141e and a plurality of second openings 142a, 142b, 142c, 142d and 142e are formed in the case 14. In the following description, all or each of the first openings of the case 14 may be referred to by reference numeral 141 and all or each of the second openings of the case 14 may be referred to by reference numeral 142. In one embodiment, the first openings 141 and the second openings 142 are formed at the bottom wall 14b. In one embodiment, the first openings 141 and the second openings 142 are alternately formed along a circumferential direction about the central axis of the case 14. Pipes for guiding the heat transfer medium from the outside of the stage ST to the inside of the stage ST and pipes for guiding the heat transfer medium from the inside of the stage ST to the outside of the stage ST are inserted into the first openings 141 and the second openings 142. The first openings 141 and the second openings 142 may be formed at the sidewall 14a of the case 14.

Figure 3:
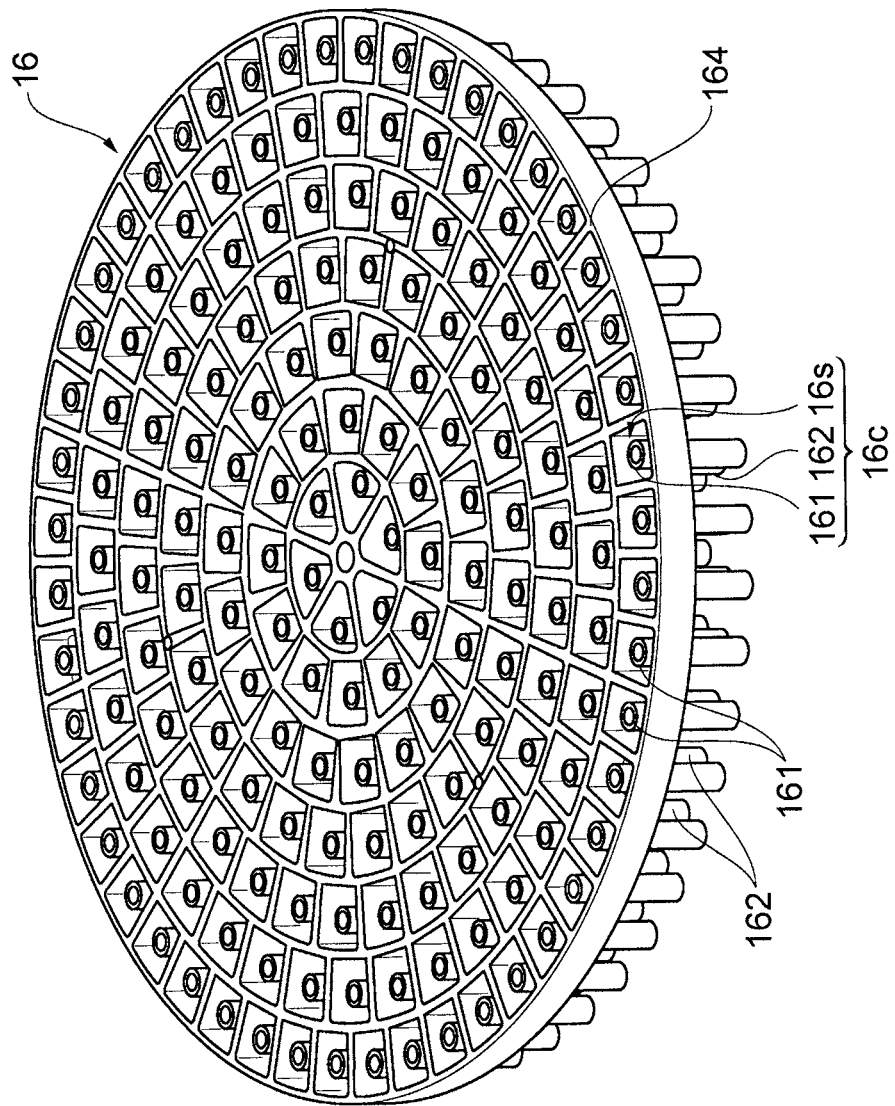
FIG. 3 is a perspective view of a heat exchanger according to an embodiment.
Figure 4A:
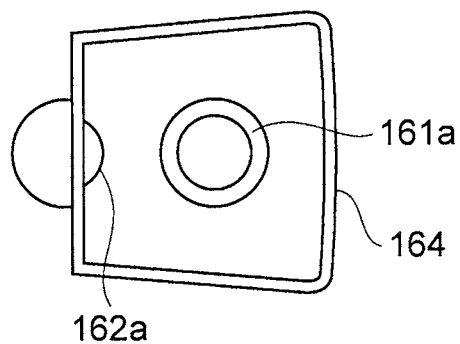
FIGS. 4A to 4C are a top view, a perspective view and another perspective view of a cell unit of the heat exchanger shown in FIG. 3, respectively.
Figure 4B:
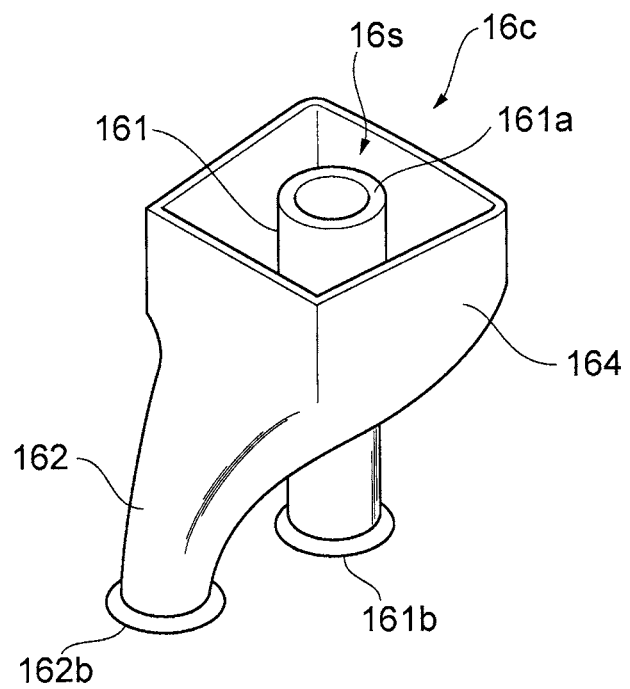
Figure 4C:
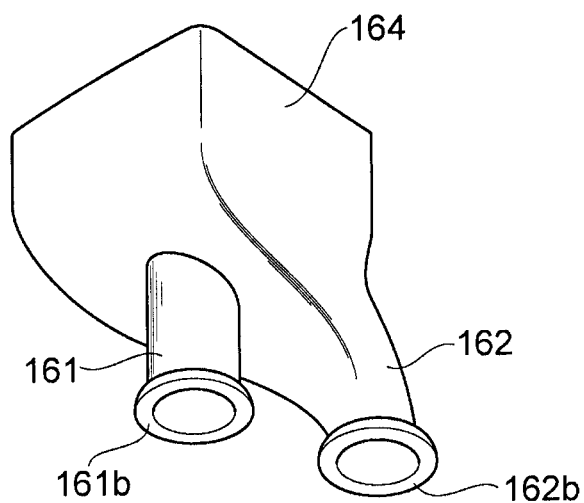
Figure 5:
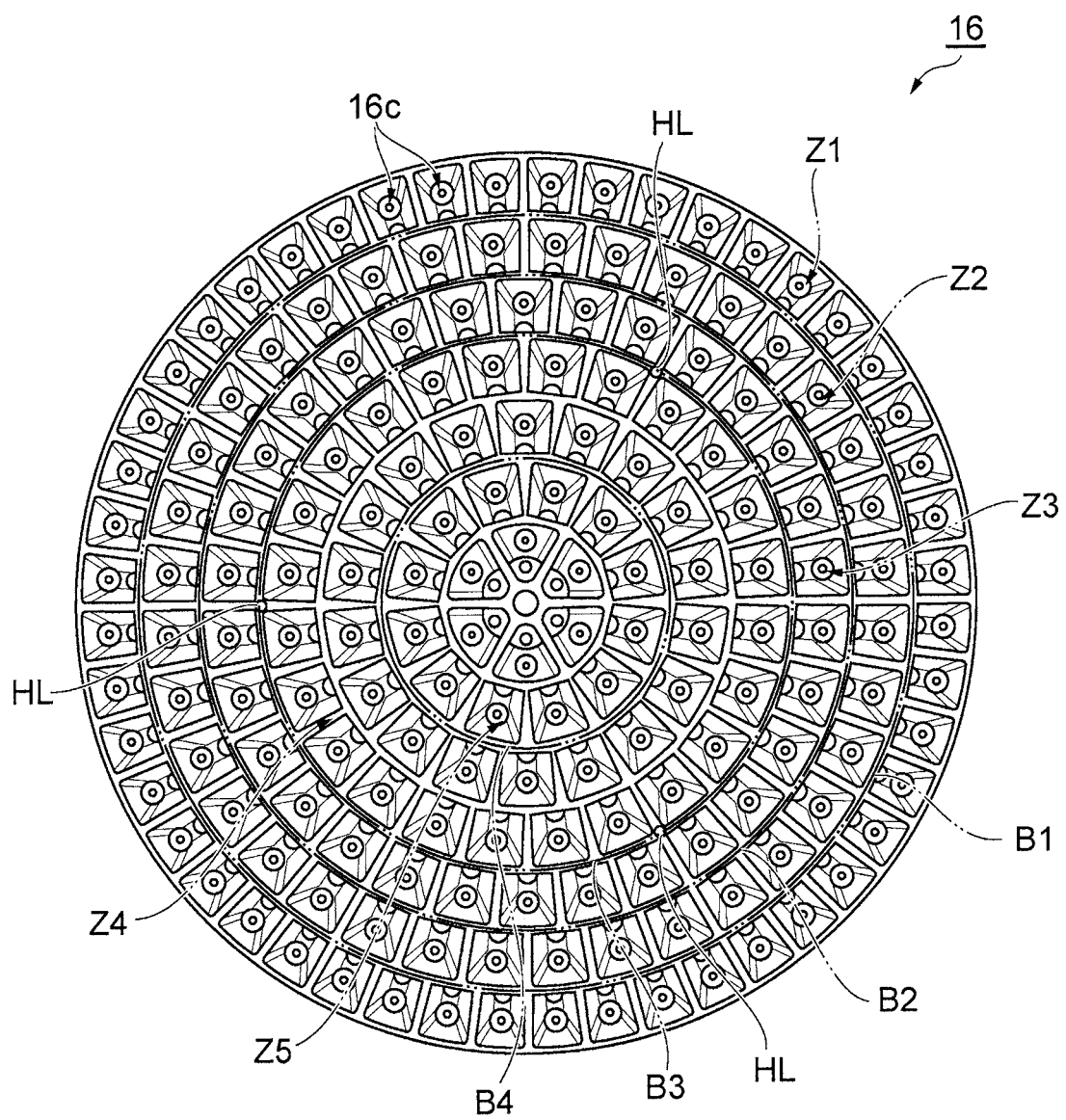
FIG. 5 is a top view of the heat exchanger according to the embodiment.

The heat exchanger 16 and the flow path unit 18 are accommodated in the accommodating space 14s of the case 14. Hereinafter, the heat exchanger 16 will be described in detail with reference to FIGS. 3 to 5. FIG. 3 is a perspective view of the heat exchanger according to the embodiment. FIGS. 4A to 4C are a top view, a perspective view and another perspective view of a cell unit of the heat exchanger shown in FIG. 3. FIG. 5 is a top view of the heat exchanger according to the embodiment.

As shown in FIG. 3, the heat exchanger 16 has a substantially circular shape when seen from the top. The heat exchanger 16 includes a plurality of first tubes 161, a plurality of second tubes 162 and a partition wall 164. The heat exchanger 16 has a plurality of cell units 16c. The cell units 16c are arranged two-dimensionally along a circumferential direction and a diametrical direction of the heat exchanger 16. Each of the cell units 16c may have a substantially rectangular shape whose width is gradually increased from the center of the heat exchanger 16 toward the outer side when seen from the top. The cell units 16c have substantially rectangular spaces 16s when seen from the top. The spaces 16s of the cell units 16c are partitioned by the partition wall 164. The spaces 16s are two-dimensionally arranged below the plate 12 without being overlapped with each other. The cell units 16c may form a honeycomb structure when seen from the top.

As shown in FIGS. 3 and 4A to 4C, each of the cell units 16c includes one of the first tubes 161 and one of the second lines 162. Each of the first tubes 161 has a first opening end 161a and a second opening end 161b. The first tubes 161 extend in parallel to one another. Each of the first tubes 161 extends from the second opening end 161b to the first opening end 161a toward the bottom surface 12b of the plate 12. The first opening ends 161a of the first tubes 161 face the bottom surface 12b of the plate 12. In each of the cell units 16c, the first tube 161 extends such that the central axis thereof coincides with the central line of the space 16s. In each of the cell units 16c, the partition wall 164 surrounds an outer peripheral surface of the first tube 161 such that the space 16s can be provided around the outer peripheral surface of the first line 161. In each of the cell units 16c, the partition wall 164 is connected to the outer peripheral surface of the first tube 161 between the first opening end 161a and the second opening end 161b to close the bottom of the space 16s around the first line 161. In each of the cell units 16c, the partition wall 164 allows the space 16s to be opened at the side opposite to the bottom of the space 16s. Further, in each of the cell units 16c, the second opening end 161b of the first tube 161 is positioned at the outside of the space 16s. Each of the first tubes 161 serves as a nozzle for discharging the heat transfer medium supplied from the first medium temperature controller 52 or the second medium temperature controller 54 into the stage ST.

Each of the second tubes 162 has a first opening end 162a and a second opening end 162b. In each of the cell units 16c, the first opening end 162a of the second tube 162 is connected to the partition wall 165 such that a flow path of the second tube 162 communicates with the bottom of the space 16s. In each of the cell units 16c, the second opening end 162b of the second tube 162 is positioned at the outside of the space 16s. In each of the cell units 16c, the second tube 162 serves as a line for discharging to the outside of the space 16s the heat transfer medium that has been discharged from the first tube 161 and returned to the space 16s.

In one embodiment, the heat exchanger 16 may be made of a material mainly containing resin, ceramic or metal. The heat exchanger 16 may be made of a material having low conductivity, e.g., ceramic or resin, in order to reduce the influence between the cell units 16c adjacent to each other. The heat exchanger 16 may be made of different materials so that the intensity and/or the thermal conductivity of the heat exchanger 16 can be partially changed. The heat exchanger 16 may be formed by using, e.g., a 3D printer.

The heat exchanger 16 has a plurality of zones and plural cell units 16c are provided in each zone. The heat transfer medium is supplied to each zone from a corresponding valve unit among a plurality of valve units of the supply system to be described later. In other words, the heat transfer medium is supplied to the zones of the stage ST from different corresponding valve units. In the example shown in FIG. 5, the heat exchanger 16 includes five zones Z1 to Z5. The five zones Z1 to Z5 are specified by a plurality of boundaries B1 to B4 arranged coaxially with respect to the central axis of the heat exchanger 16. The boundaries B1 to B4 are circles that share the central axis of the heat exchanger 16 when seen from the top. The zones Z1 to Z4 extend annularly about the central axis of the heat exchanger 16. The zone Z2 is located at an inner side of the zone Z1. The zone Z3 is located at an inner side of the zone Z2. The zone Z4 is located at an inner side of the zone Z3. The zone Z5 intersects with the central axis of the heat exchanger 16 and is located at an inner side of the zone Z4.

Three holes HL are formed at the heat exchanger 16. The three holes HL penetrate through the partition wall 164 along the thickness direction of the heat exchanger 16. In one embodiment, the three holes HL are provided on the boundary B3. Lift pins used for vertically moving the substrate on the electrostatic chuck 20 are inserted into the respective holes HL.

Figure 6:
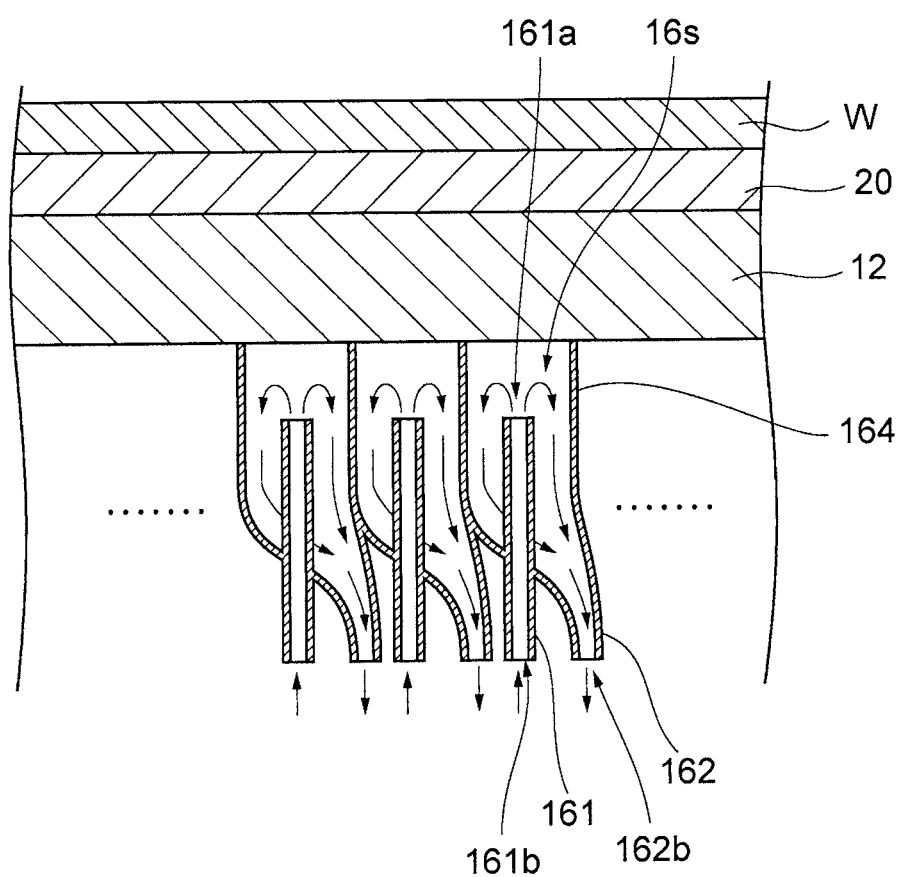
FIG. 6 is a cross sectional view schematically showing flow of a heat transfer medium in the heat exchanger according to the embodiment.

Hereinafter, the flow of the heat transfer medium in the heat exchanger 16 will be described with reference to FIG. 6. FIG. 6 is a cross sectional view schematically showing the flow of the heat transfer medium in the heat exchanger according to the embodiment. The heat transfer medium, which is supplied from the first medium temperature controller 52 or the second medium temperature controller 54 to reach the second opening ends 161b of the first tubes 161, passes through flow paths of the first tubes 161 and then is discharged through the first opening ends 161a of the first tubes 161 toward the bottom surface 12b of the plate 12. The heat transfer medium discharged through the first opening ends 161a of the first tubes 161 exchanges heat with the plate 12. The heat transfer medium that has exchanged the heat moves along the partition wall 164 and then is discharged through the second opening ends 162b of the second tubes 162 to the outside of the space 16s.

Figure 7:
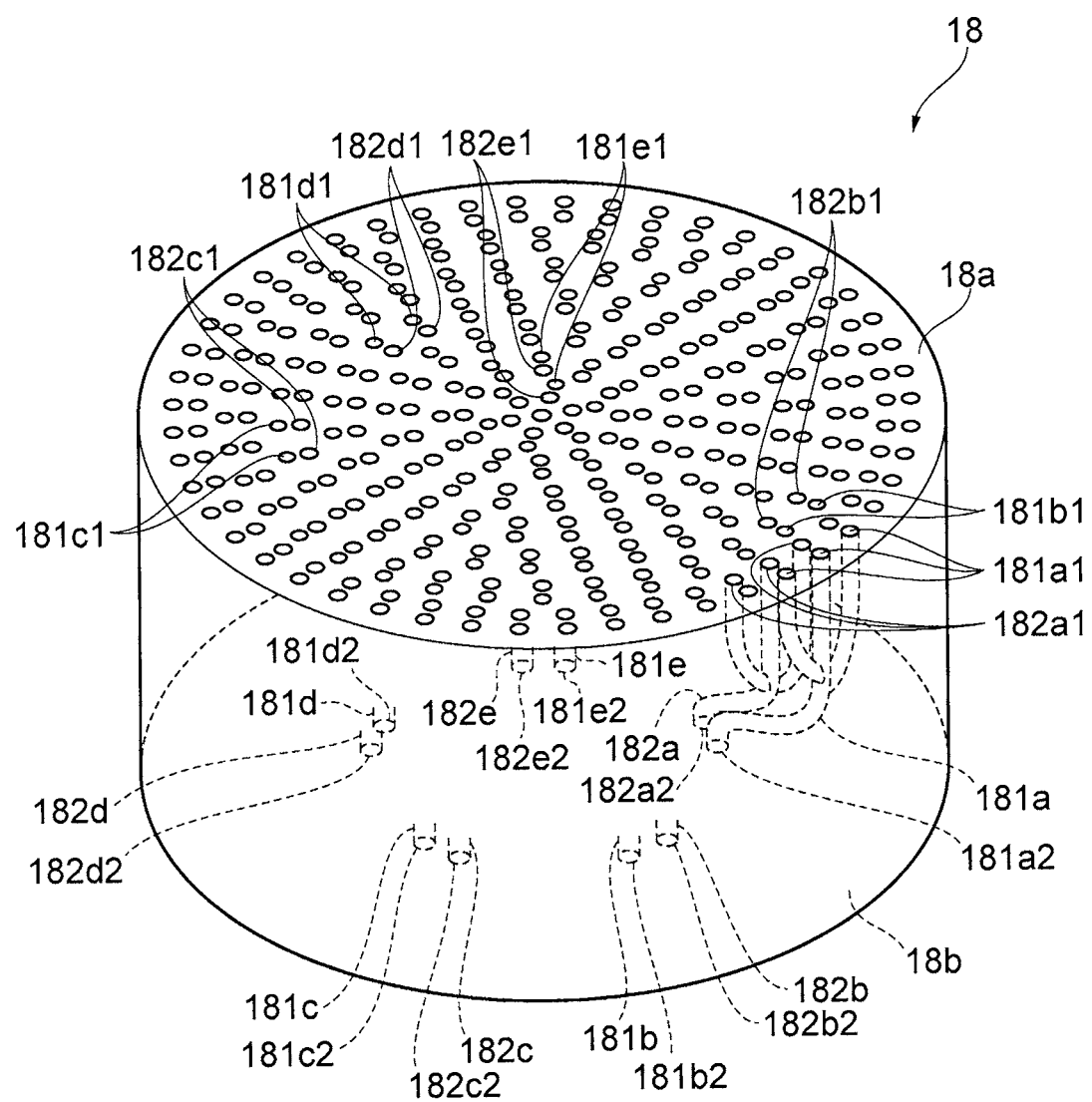
FIG. 7 is a perspective view of a flow path unit according to an embodiment.

Next, the flow path unit 18 will be described. FIG. 7 is a perspective view of the flow path unit according to the embodiment. The flow path unit 18 is disposed below the heat exchanger 16. The flow path unit 18 has a flow path for supplying the heat transfer medium to the heat exchanger 16 and a flow path through which the heat transfer medium from the heat exchanger 16 returns to the first medium temperature controller 52 or the second medium temperature controller 54.

As shown in FIG. 7, the flow path unit 18 is a substantially cylindrical block. The flow path unit 18 has a top surface 18a and a bottom surface 18b. A plurality of supply paths 181a, 181b, 181c, 181d and 181e and a plurality of return paths 182a, 182b, 182c, 182d and 182e are formed through the flow path unit 18. In the following description, all or each of the supply paths in the flow path unit 18 may be referred to by reference numeral 181 and all or each of the return paths in the flow path unit 18 may be referred to by reference numeral 182. A plurality of cavities having a small diameter and extending from the bottom surface 18b to the top surface 18a is formed in the flow path unit 18. These cavities form the supply paths 181 and the return paths 182. In FIG. 7, a part of the supply paths 181 and a part of the return paths 182 are illustrated, for convenience. The supply paths 181 and the return paths 182 may be configured as a plurality of tubes.

The supply path 181a has a plurality of first ends 181a1 and a second end 181a2 and is branched in the middle thereof. In other words, the supply path 181a includes a single path extending from the second end 181a2 and a plurality of branch paths which is branched from the single path to reach the first ends 181a1. The first ends 181a1 are formed at the top surface 18a and the second end 181a2 is formed at the bottom surface 18b. The first ends 181a1 are connected to the second opening ends 161b of the first tubes 161 included in the zone Z1. The second end 181a2 faces the first opening 141a of the case 14. Further, the second end 181a2 may be formed at a side surface of the flow path unit 18.

The return path 182a has a plurality of first ends 182a1 and a second end 182a2. The return path 182a is branched in the middle thereof. In other words, the return path 182a includes a single path extending from the second end 182a2 and a plurality of branch paths which is branched from the single path to reach the first ends 182a1. The first ends 182a1 are formed at the top surface 18a and the second end 182*a*2 is formed at the bottom surface 18*b*. The first ends 182*a*1 are connected to the second opening ends 162*b* of the second tubes 162 included in the zone Z1. The second end 182*a*2 faces the second opening 142*a* of the case 14. Further, the second end 182*a*2 may be formed at a side surface of the flow path unit 18.

Similarly to the supply path 181*a*, the supply paths 181*b*, 181*c*, 181*d* and 181*e* have a plurality of first ends 181*b*1, a plurality of first ends 181*c*1, a plurality of first ends 181*d*1 and a plurality of first ends 181*e*1, respectively. The supply paths 181*b*, 181*c*, 181*d* and 181*e* have a second end 181*b*2, a second end 181*c*2, a second end 181*d*2 and a second end 181*e*2, respectively. The first ends 181*b*1, 181*c*1, 181*d*1 and 181*e*1 are formed at the top surface 18*a*. The second ends 181*b*2, 181*c*2, 181*d*2 and 181*e*2 are formed at the bottom surface 18*b*. The first ends 181*b*1 are connected to the second opening ends 161*b* of the first tubes 161 in the zone Z2. The first ends 181*c*1 are connected to the second opening ends 161*b* of the first tubes 161 in the zone Z3. The first ends 181*d*1 are connected to the second opening ends 161*b* of the first tubes 161 in the zone Z4. The first ends 181*e*1 are connected to the second opening ends 161*b* of the first tubes 161 in the zone Z5. The second ends 181*b*2, 181*c*2, 181*d*2 and 181*e*2 face the first openings 141*b*, 141*c*, 141*d* and 141*e* of the case 14, respectively. The second ends 181*b*2, 181*c*2, 181*d*2 and 181*e*2 may be formed at a side surface of the flow path unit 18.

Similar to the return path 182*a*, the return paths 182*b*, 182*c*, 182*d* and 182*e* have a plurality of first ends 182*b*1, a plurality of first ends 182*c*1, a plurality of first ends 182*d*1 and a plurality of first ends 182*e*1, respectively. Further, the return paths 182*b*, 182*c*, 182*d* and 182*e* have a second end 182*b*2, a second end 182*c*2, a second end 182*d*2 and a second end 182*e*2, respectively. The first ends 182*b*1, 182*c*1, 182*d*1 and 182*e*1 are formed at the top surface 18*a*. The second ends 182*b*2, 182*c*2, 182*d*2 and 182*e*2 are formed at the bottom surface 18*b*. The first ends 182*b*1 are connected to the second opening ends 162*b* of the second tubes 162 in the zone Z2. The first ends 182*c*1 are connected to the second opening ends 162*b* of the second tubes 162 in the zone Z3. The first ends 182*d*1 are connected to the second opening ends 162*b* of the second tubes 162 in the zone Z4. The first ends 182*e*1 are connected to the second opening ends 162*b* of the second tubes 162 in the zone Z5. The second ends 182*b*2, 182*c*2, 182*d*2 and 182*e*2 face the second openings 142*b*, 142*c*, 142*d* and 142*e* of the case 14, respectively. Further, the second ends 182*b*2, 182*c*2, 182*d*2 and 182*e*2 may be formed at a side surface of the flow path unit 18.

In one embodiment, the supply paths 181 have the same conductance and the return paths 182 have the same conductance. Here, the conductance is an index indicating flowability of fluid which is determined by a diameter, a length and a refractive index of a flow path. For example, diameters and refractive indexes of the supply paths 181 and the return paths 182 are controlled depending on flow path lengths. In one embodiment, the flow path unit 18 may be made of a material having low conductivity, e.g., a material mainly containing ceramic or resin, so that the influence between the adjacent flow paths can be reduced. The flow path unit 18 may be formed by using, e.g., a 3D printer.

In the stage ST, the heat transfer medium can be supplied to each of the zones. Therefore, temperatures of the zones of the stage ST can be individually controlled and, further, temperatures of regions of the substrate W which correspond to the zones of the stage ST can be individually controlled.

Figure 8:
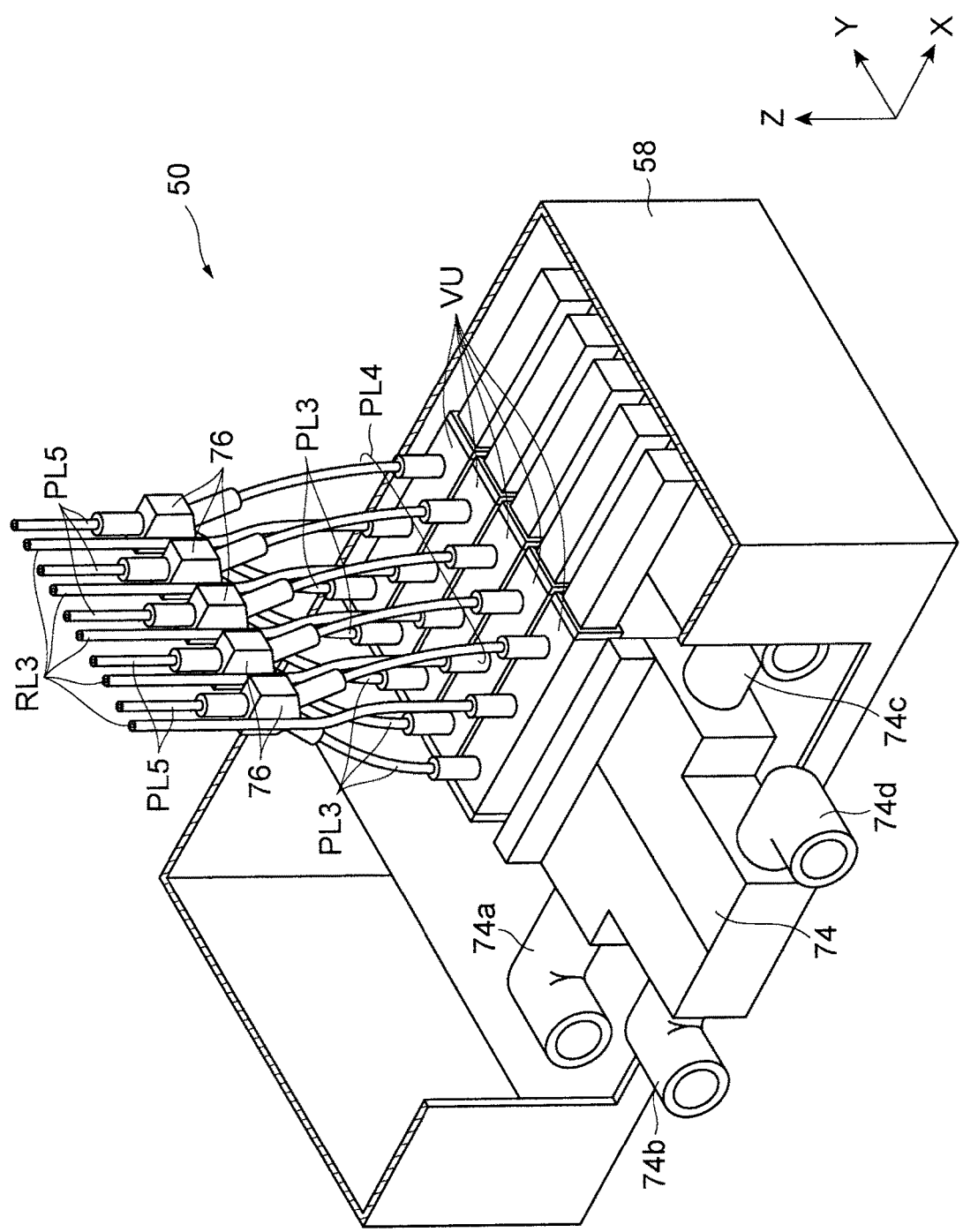
FIG. 8 is a perspective view of a supply system according to an embodiment with a case cut.
Figure 9:
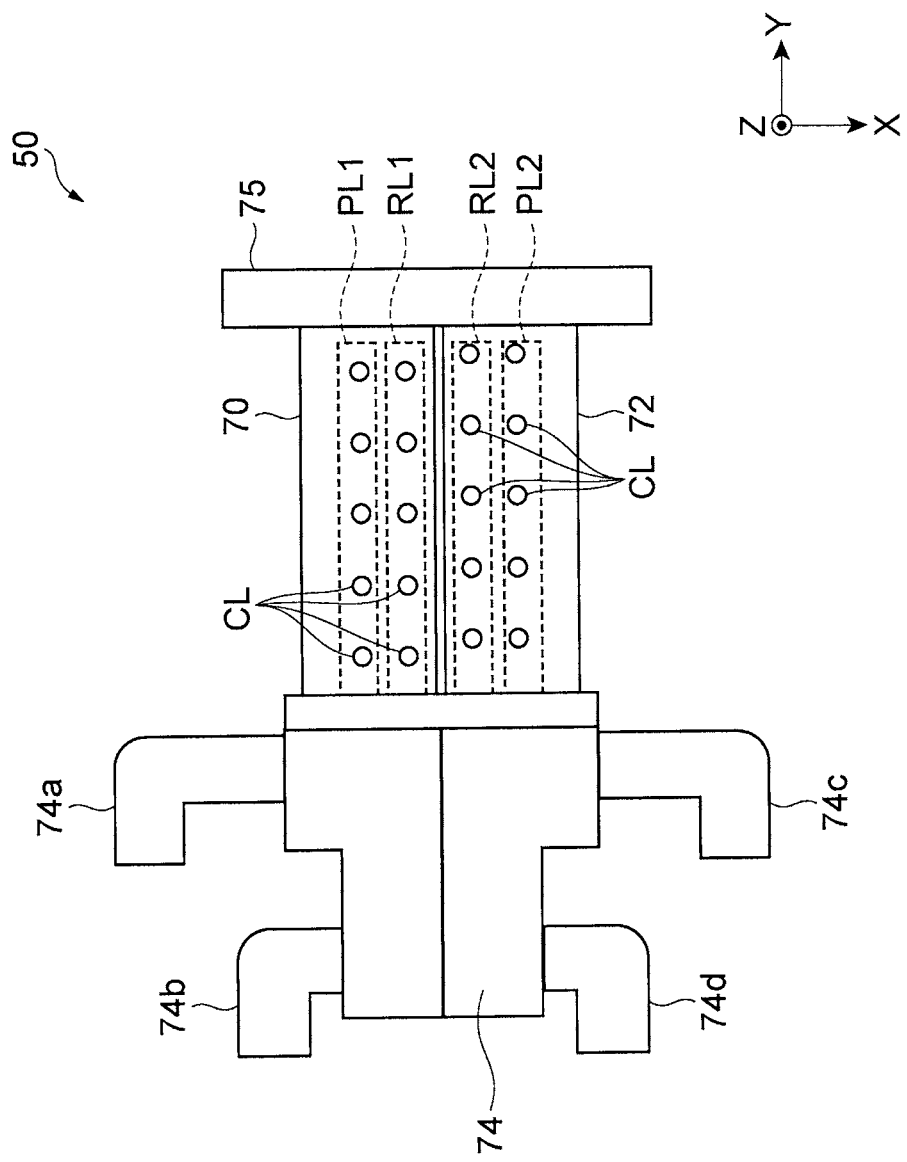
FIG. 9 is a top view of the supply system shown in FIG. 8 in which illustration of a plurality of valve units is omitted.

Hereinafter, the supply system 50 will be described in detail. FIG. 8 is a perspective view of the supply system according to the embodiment with the case cut. FIG. 9 is a top view of the supply system shown in FIG. 8 in which a plurality of valve units is omitted. The supply system 50 alternately supplies the first heat transfer medium outputted from the first medium temperature controller 52 and the second heat transfer medium outputted from the second medium temperature controller 54 to the zones of the stage ST. In one embodiment, the supply system 50 is installed at the chamber main body 11 below the stage ST. Further, the supply system 50 may be installed at the chamber main body 11 at the side of the stage ST.

The supply system 50 includes a first supply line PL1, a second supply line PL2, a plurality of third supply lines PL3, a plurality of fourth supply lines PL4 and a plurality of valve units VU. In one embodiment, the supply system 50 includes a case 58. The case 58 has a box shape. The valve units VU are accommodated in the case 58. In addition, a first member 70, a second member 72 and a plurality of joints 76 which will be described later are also accommodated in the case 58.

The first supply line PL1 supplies the first heat transfer medium outputted from the first medium temperature controller 52 to the valve units VU. The first supply line PL1 is connected to a supply port 52*a* of the first medium temperature controller 52 (see FIG. 1). The supply port 52*a* is a port for outputting the first heat transfer medium. The second supply line PL2 supplies the second heat transfer medium outputted from the second medium temperature controller 54 to the valve units VU. The second supply line PL2 is connected to a supply port 54*a* of the second medium temperature controller 54 (see FIG. 1). The supply port 54*a* is a port for outputting the second heat transfer medium.

The third supply lines PL3 feed the first heat transfer medium supplied from the first supply lines PL1 through the valve units VU to the zones of the stage ST. In one embodiment, the third supply lines PL3 are configured as a plurality of lines. The fourth supply lines PL4 feed the second heat transfer medium supplied from the second supply lines PL2 through the valve units VU to the zones of the stage ST. In one embodiment, the fourth supply lines PL4 are configured as a plurality of lines.

Each of the valve units VU is configured to alternately supply the first heat transfer medium and the second heat transfer medium to a corresponding zone among the zones of the stage ST. The valve units VU will be described in detail later.

In one embodiment, the supply system 50 further includes a first return line RL1, a second return line RL2 and a plurality of third return lines RL3. The first return line RL1 feeds the heat transfer medium returning from the stage ST through the valve units VU to the first medium temperature controller 52. The first return line RL1 is connected to a return port 52*b* of the first medium temperature controller 52 (see FIG. 1). The return port 52*b* allows the first medium temperature controller 52 to receive the heat transfer medium returning from the stage ST.

The second return line RL2 feeds the heat transfer medium returning from the stage ST through the valve units VU to the second medium temperature controller 54. The second return line RL2 is connected to a return port 54*b* of the second medium temperature controller 54 (see FIG. 1). The return port 54*b* allows the second medium temperature controller 54 to receive the heat transfer medium returning from the stage ST.

The third return lines RL3 feed the heat transfer medium returning from the zones of the stage ST to the valve units VU. In one embodiment, the third return lines RL3 are configured as a plurality of lines. The third return lines RL3 communicate with the second openings 142a, 142b, 142c, 142d and 142e of the case 14. The third return lines RL3 are connected to the second ends 182a2, 182b2, 182c2, 182d2 and 182e2 of the flow path unit 16.

Figure 10:
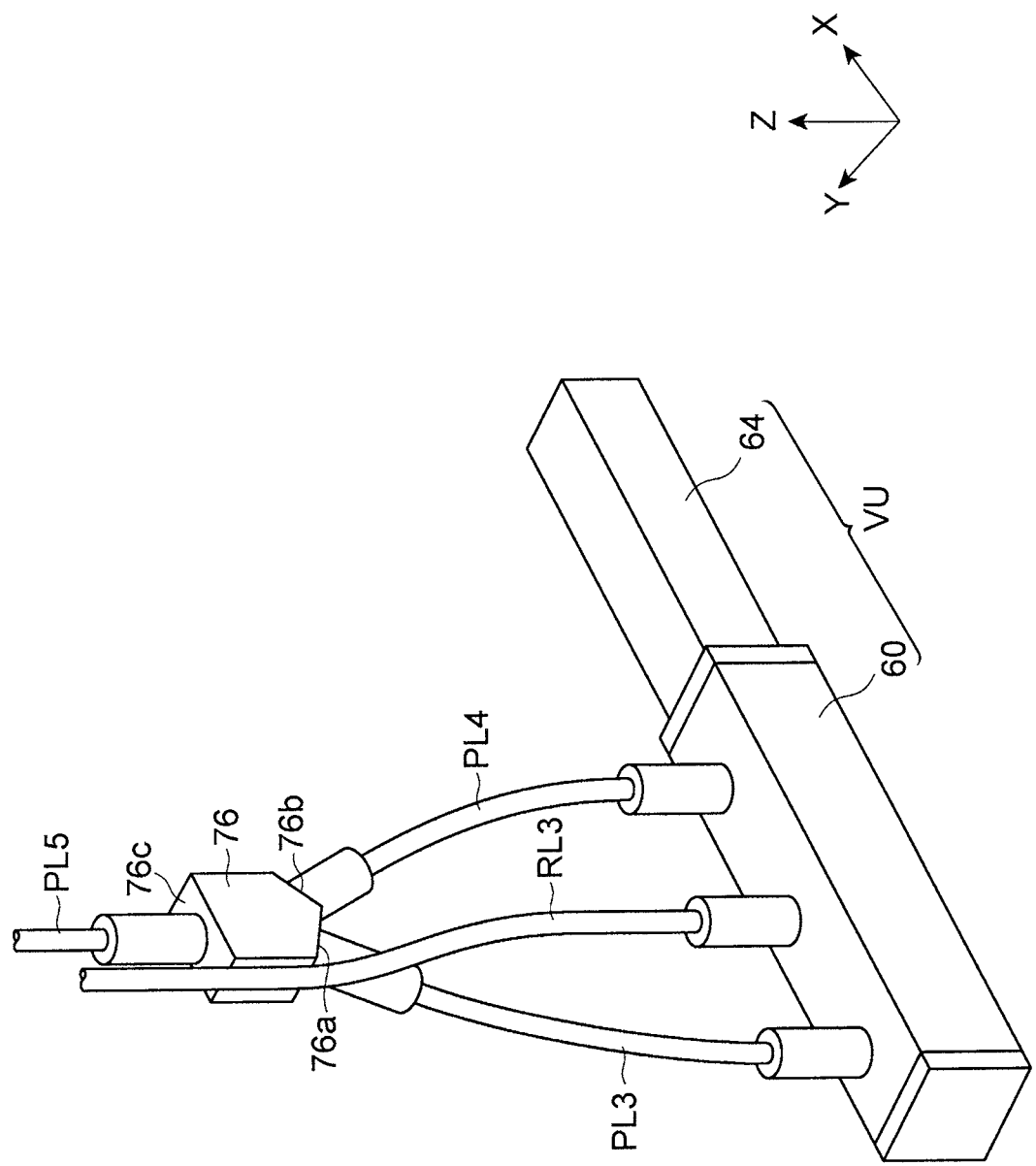
FIG. 10 is a perspective view showing a valve unit according to an embodiment together with a third supply line, a fourth supply line and a third return line.
Figure 11:
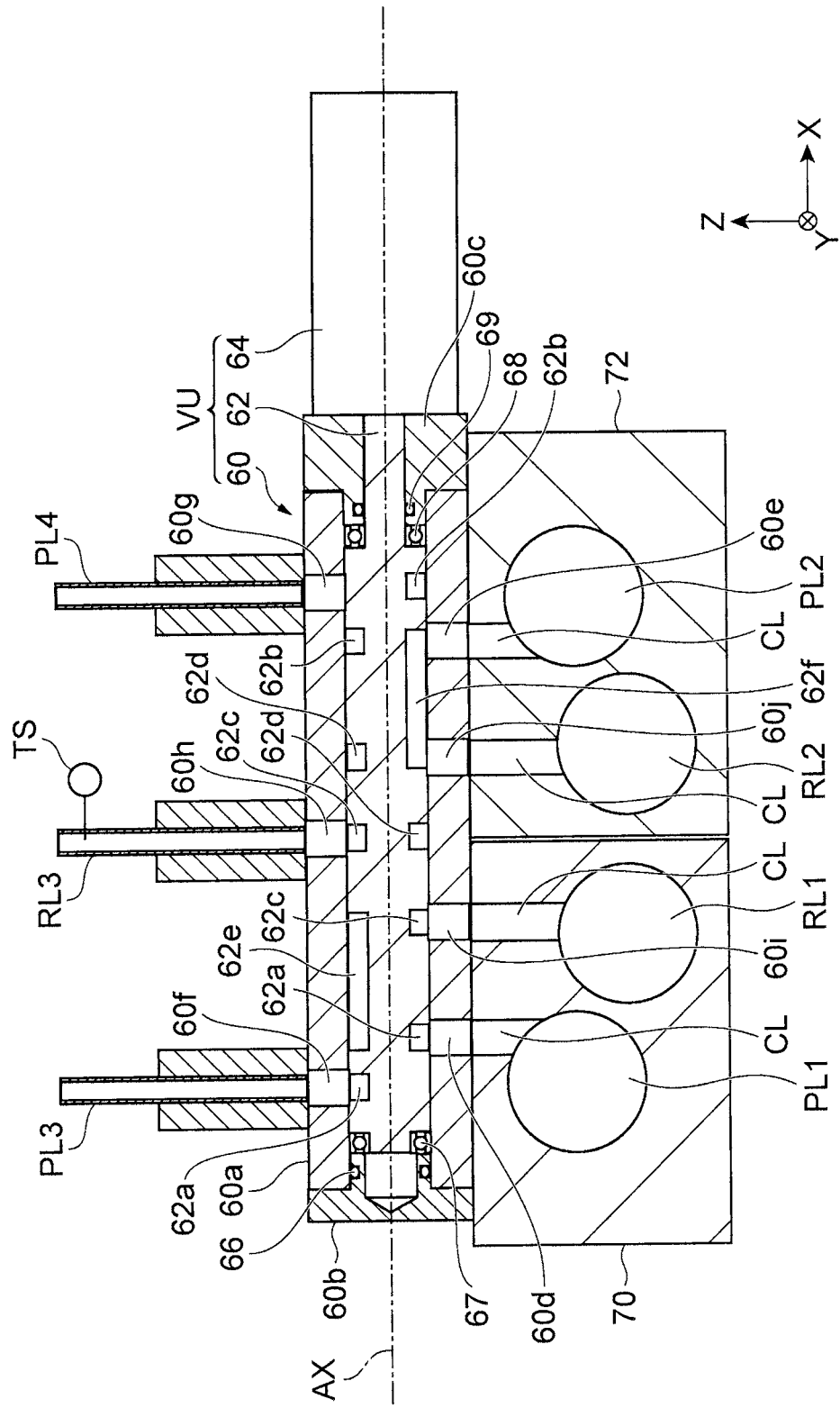
FIG. 11 is a cross sectional view of the supply system including the valve unit according to the embodiment.
Figure 12:
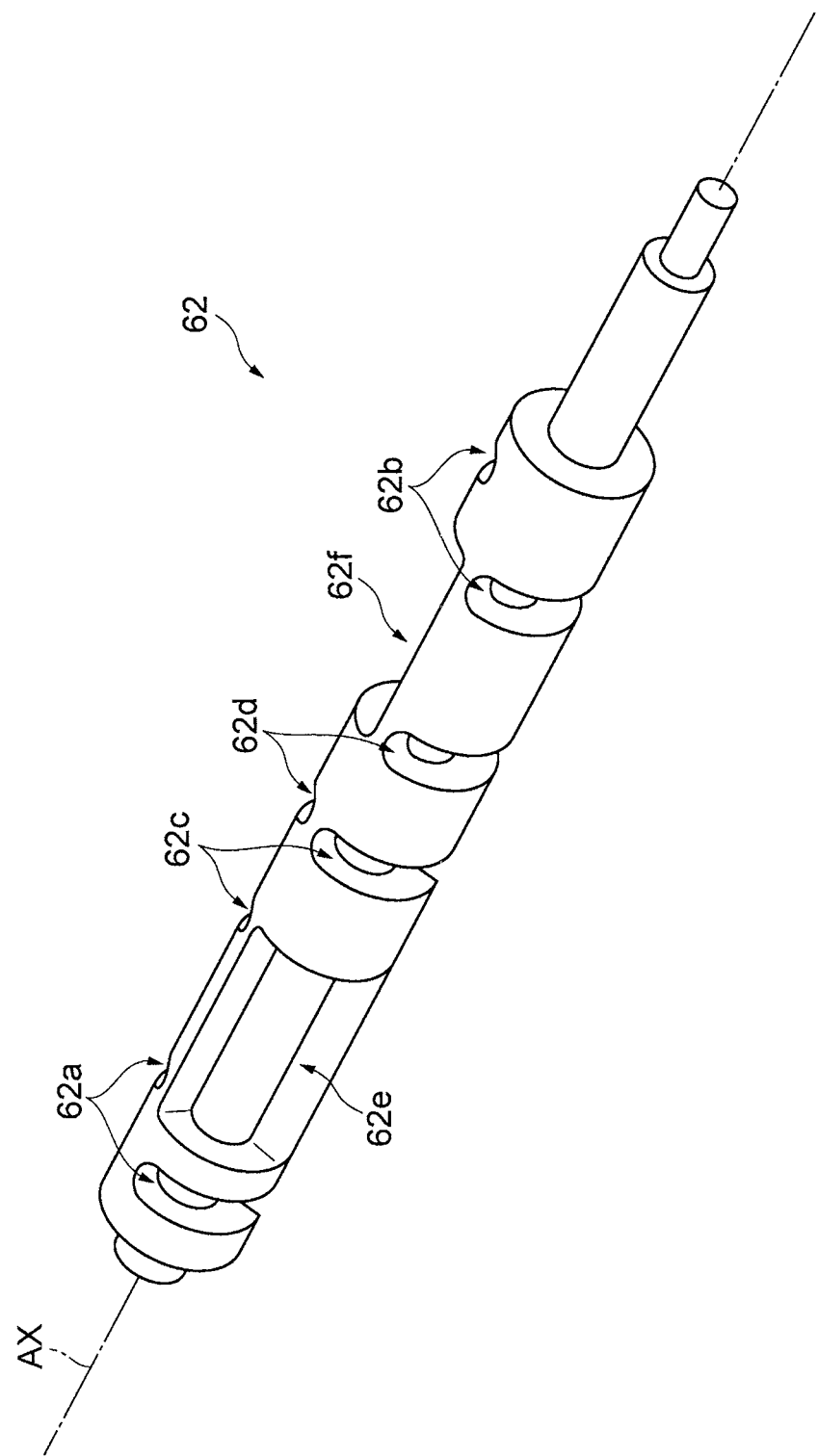
FIG. 12 is a perspective view of a shaft body of the valve unit according to the embodiment.
Figure 13:
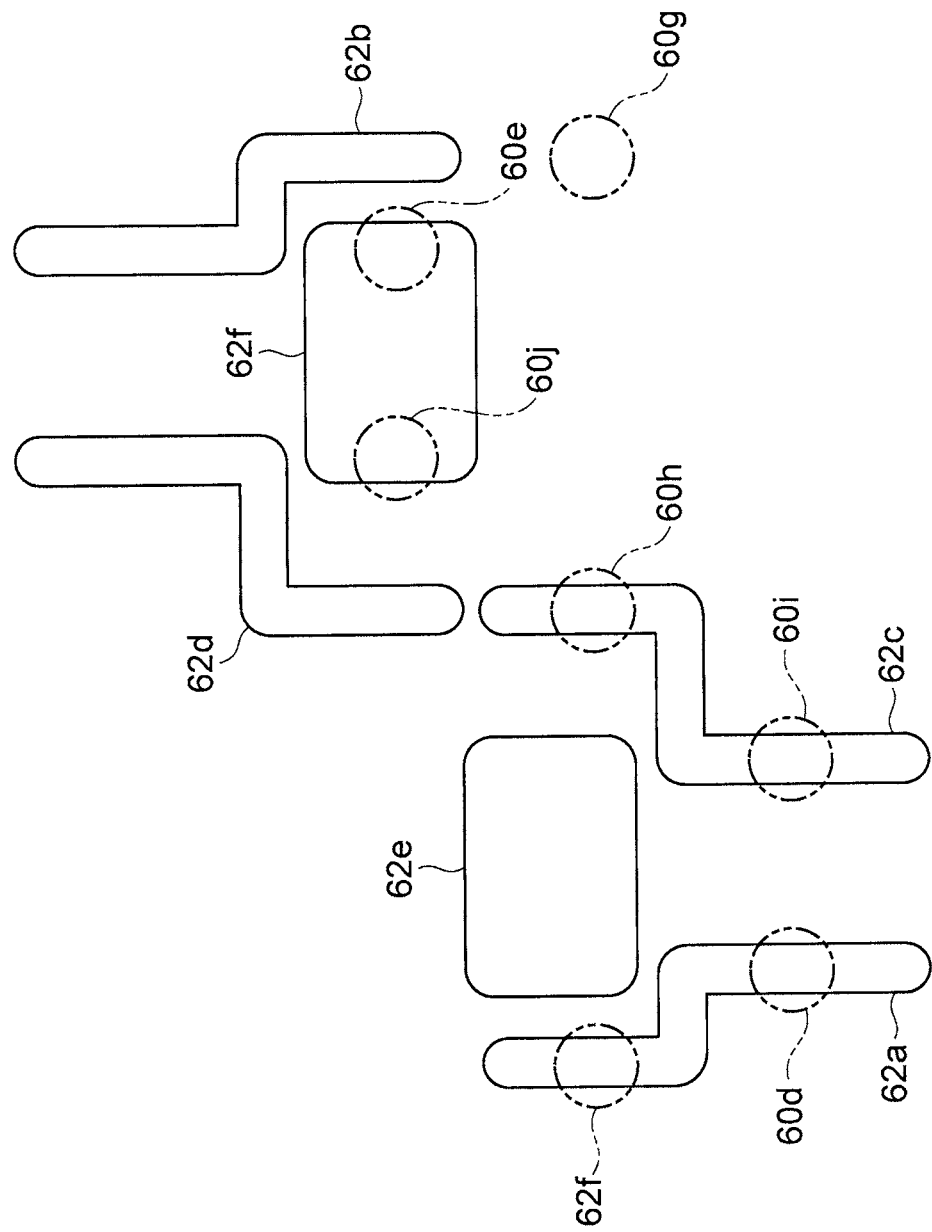
FIG. 13 is a developed view of a surface of the shaft body of the valve unit according to the embodiment.
Figure 14:
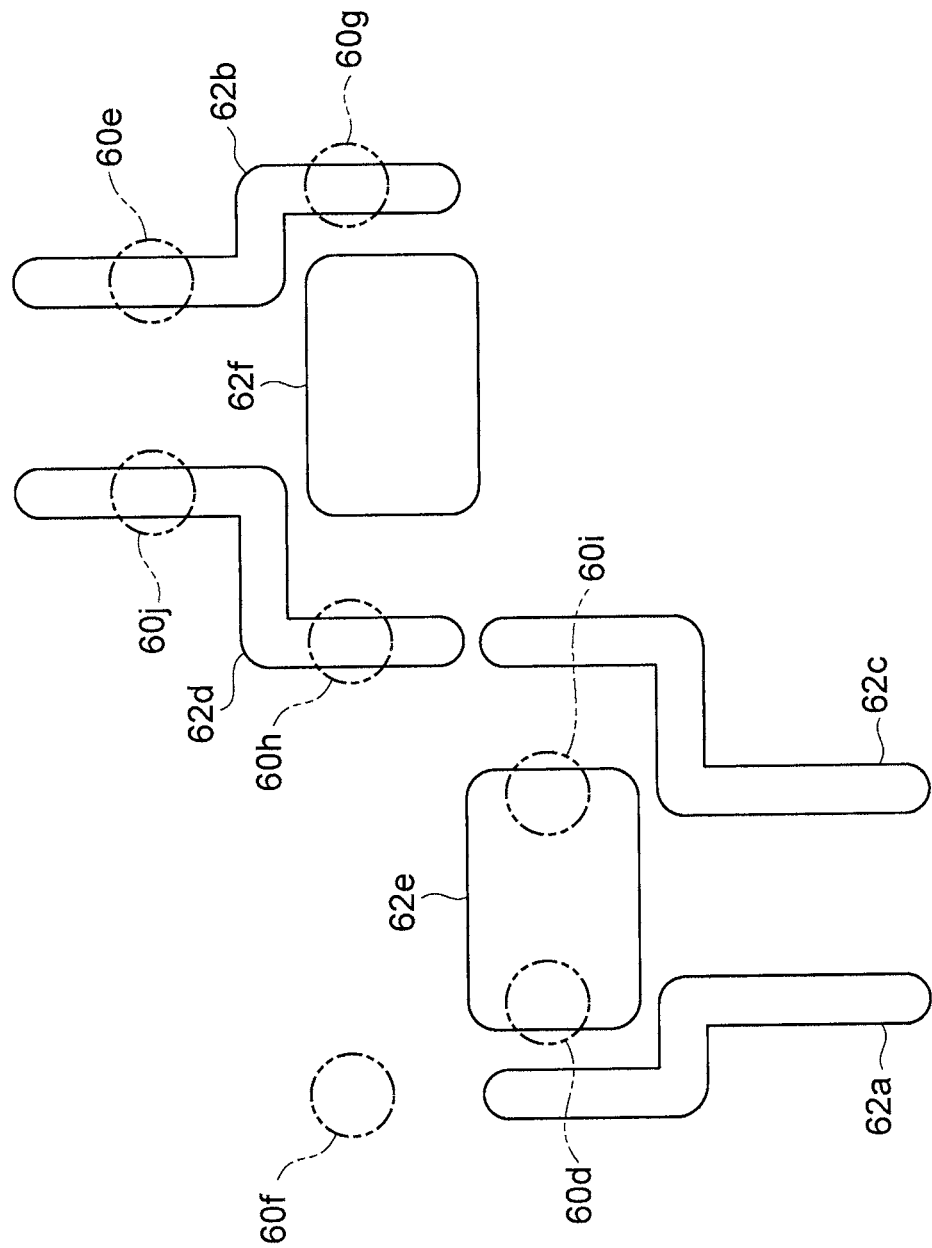
FIG. 14 is another developed view of the surface of the shaft body of the valve unit according to the embodiment.

Hereinafter, the valve units VU will be described in detail. The valve units VU have the same configuration. Therefore, only one of the valve units VD will be described. FIG. 10 is a perspective view showing the valve unit according to an embodiment together with a third supply line, a fourth supply line and a third return line. FIG. 11 is a cross sectional view of the supply system including the valve unit according to the embodiment. FIG. 12 is a perspective view of a shaft body of the valve unit according to the embodiment. FIGS. 13 and 14 are developed views of a surface of the shaft body of the valve unit according to the embodiment. Hereinafter, FIGS. 10 to 14 will be referred to together with FIGS. 8 and 9.

The valve unit VU includes a housing 60, a shaft body and a driving unit 64. The housing 60 has a tubular shape. The housing 60 extends in a second direction (hereinafter, referred to as "X direction") perpendicular to a first direction (hereinafter, referred to as "Y direction") in which the first supply line PL1, the second supply line PL2, the first return line RL1 and the second return line RL2 extend. The X direction is a direction in which the central axis AX of the shaft body 62 extends.

An inner space of the housing 60 serves as a space into which the shaft body 62 is inserted. In one embodiment, the housing 60 includes a main body 60a, a member 60b and a member 60c. The main body 60a is formed in a tubular shape having openings at both ends thereof. The member 60b is fixed to one end of the main body 60a and blocks the opening formed at one end of the main body 60a. An O ring 66 is provided between the main body 60a and the member 60b. The O ring 66 is made of, e.g., silicon rubber. The member 60c is a tubular member fixed to the other end of the main body 60a. The hole of the member 60c communicates with the inner space of the main body 60a.

The housing 60 has a first inlet 60d, a second inlet 60e, a first outlet 60f and a second outlet 60g. In one embodiment, the housing 60 further has a third inlet 60h, a third outlet 60i and a fourth outlet 60j. The first inlet 60d, the second inlet 60e, the first outlet 60f, the second outlet 60g, the third inlet 60h, the third outlet 60i and the fourth outlet 60j penetrate through the main body 60a to communicate with the inner space of the housing 60.

The first inlet 60d, the second inlet 60e, the third outlet 60i and the fourth outlet 60j are arranged in parallel to the central axis AX of the shaft body 62. In other words, the first inlet 60d, the second inlet 60e, the third outlet 60i and the fourth outlet 60j are arranged along the X direction. The third outlet 60i and the fourth outlet 60j are provided between the first inlet 60d and the second inlet 60e in the X direction.

The first outlet 60f, the second outlet 60g and the third inlet 60h are formed at a portion of the main body 60a which is opposite to the portion where the first inlet 60d, the second inlet 60e, the third outlet 60i and the fourth outlet 60j are formed. The first outlet 60f, the second outlet 60g and the third inlet 60h are arranged along the X direction. The third inlet 60h is provided between the first outlet 60f and the second outlet 60g in the X direction.

The first inlet 60d is connected to the first supply line PL1. The second inlet 60e is connected to the second supply line PL2. The first outlet 60f is connected to one of the third supply lines PL3 which feeds the first heat transfer medium to a corresponding zone among the zones of the stage ST. The second outlet 60g is connected to one of the fourth supply lines PL4 which feeds the second heat transfer medium to the corresponding zone.

The third inlet 60h is connected to one of the third return lines RL3 which feeds the heat transfer medium returning from the corresponding zone. The third outlet 60i is connected to the first return line RL1. The fourth outlet 60j is connected to the second return line RL2.

The shaft body 62 is inserted into the housing 60. A small gap is formed between the shaft body 62 and an inner surface of the housing 60. A length of the gap between the shaft body 62 and the inner space of the housing 60 ranges from a few microns to several tens of microns, for example. A bearing 67 is provided between one end portion of the shaft body 62 and the housing 60. The other end portion of the shaft body 62 is coupled to a driving shaft of the driving unit 64 at the outside of the housing 60. The driving unit 64 is, e.g., a motor, and generates a driving force for rotating the shaft body 62 about the central axis AX. A bearing 68 is provided between the other end portion of the shaft body 62 and the housing 60. An O ring 69 is provided between the other end portion of the shaft body 62 and the housing 60. The O ring 69 serves as a sealing member for sealing the space in the housing 60. When the shaft body 62 is rotated, friction occurs between the shaft body 62 and the O ring 69. Therefore, the O ring 69 requires higher durability against friction, compared to the O ring 66. Accordingly, the O ring 69 is made of, e.g., ethylene-propylene rubber.

A first supply groove 62a and a second supply groove 62b are formed on the shaft body 62. In one embodiment, a first return groove 62c and a second return groove 62d are formed on the shaft body 62. The first supply groove 62a, the second supply groove 62b, the first return groove 62c and the second return groove 62d extend on the surface of the shaft body 62 along the circumferential direction. In another embodiment, a third return groove 62e and a fourth return groove 62f are formed on the shaft body 62.

As shown in FIG. 13, when a rotation angle about the central axis AX of the shaft body 62 is within a first angle range, the first supply groove 62a communicates with the first inlet 60d and the first outlet 60f and connects the first inlet 60d to the first output 60f. Accordingly, the supply port 52a of the first medium temperature controller is connected to a corresponding zone of the stage ST through the first supply line PL1, the first inlet 60d, the first supply groove 62a, the first outlet 60f and the third supply line PL3.

As shown in FIG. 14, when a rotation angle about the central axis AX of the shaft body 62 is within a second angle range, the second supply groove 62b communicates with the second inlet 60e and the second outlet 60g and connects the second inlet 60e to the second outlet 60g. Accordingly, the supply port 54a of the second medium temperature controller 54 is connected to a corresponding zone of the stage ST through the second supply line PL2, the second inlet 60e, the second supply groove 62b, the second outlet 60g and the fourth supply line PL4.

Therefore, in the supply system 50, the first heat transfer medium and the second heat transfer medium are alternately supplied to each of the zones of the stage ST by a few valve units VU. Accordingly, the size of the apparatus can be reduced. In the valve unit VU of the supply system 50, the connection/disconnection of the first inlet 60d and the first outlet 60f and the connection/disconnection of the second inlet 60e and the second outlet 60g are switched by the rotation of the shaft body 62. As a consequence, the valve unit VU of the supply system 50 has excellent durability and can operate at a high operation speed.

As shown in FIG. 13, when a rotation angle about the central axis AX of the shaft body 62 is within the first angle range, the first return groove 62c communicates with the third inlet 60h and the third outlet 60i and connects the third inlet 60h to the third outlet 60i. Therefore, the return port 52b of the first medium temperature controller is connected to a corresponding zone of the stage ST through the third return line RL3, the third inlet 60h, the first return groove 62c, the third outlet 60i and the first return line RL1. Accordingly, the heat transfer medium returns to the first medium temperature controller 52 when the first heat transfer medium is supplied to the corresponding zone of the stage ST.

As shown in FIG. 14, when a rotation angle about the central axis AX of the shaft body 62 is within the second angle range, the second return groove 62d communicates with the third inlet 60h and the fourth outlet 60j and connects the third inlet 60h to the fourth outlet 60j. Therefore, the return port 54b of the second medium temperature controller 54 is connected to a corresponding zone of the stage ST through the third return line RL3, the third inlet 60h, the second return groove 62d, the fourth outlet 60j and the second return line RL2. Accordingly, the heat transfer medium returns to the second medium temperature controller 54 when the second heat transfer medium is supplied to the corresponding zone of the stage ST.

In one embodiment, as shown in FIG. 12, the first return groove 62c and the second return groove 62d are formed between the first supply groove 62a and the second supply groove 62b in the X direction. In the configuration in which the first return groove 62c and the second return groove 62d are formed between the first supply groove 62a and the second supply groove 62b in the X direction, the first supply groove 62a and the second supply groove 62b are spaced apart from each other by a large distance. Therefore, the heat exchange between the first heat transfer medium and the second heat transfer medium through the shaft body 62 is suppressed. As a result, the temperature variation of the first heat transfer medium and that of the second heat transfer medium are suppressed.

In one embodiment, the third return groove 62e and the fourth return groove 62f are further formed on the shaft body 62. As shown in FIG. 14, when a rotation angle about the central axis AX of the shaft body 62 is within the second angle range, the third return groove 62e communicates with the first inlet 60d and the third outlet 60i and connects the first inlet 60d to the third outlet 60i. Accordingly, the supply port 52a of the first medium temperature controller 52 is connected to the return port 52b of the first medium temperature controller 52 through the first supply line PL1, the first inlet 60d, the third return groove 62e, the third outlet 60i and the first return line RL1. Therefore, when the second heat transfer medium is supplied from the valve unit VU to the stage ST, the first heat transfer medium supplied from the first medium temperature controller 52 to the valve unit VU returns to the first medium temperature controller 52 from the corresponding valve unit VU without being supplied to the stage ST.

As shown in FIG. 13, when a rotation angle about the central axis AX of the shaft body 62 is within the first angle range, the fourth return groove 62e communicates with the first inlet 60d and the third outlet 60i and connects the first inlet 60d to the third outlet 60i. The fourth return groove 62f connects the second inlet 60e and the fourth outlet 60j while facing the second inlet 60e and the fourth outlet 60j. Therefore, the supply port 54a of the second medium temperature controller 54 is connected to the return port 54b of the second medium temperature controller 54 through the second supply line PL2, the second inlet 60e, the fourth return groove 62f, the fourth outlet 60j and the second return line RL2. Accordingly, when the first heat transfer medium is supplied from the valve unit VU to the stage ST, the second heat transfer medium supplied from the second medium temperature controller 54 to the valve unit VU returns to the second medium temperature controller 54 from the corresponding valve unit VU without being supplied to the stage ST.

In one embodiment, the third return groove 62e is formed between the first supply groove 62a and the first return groove 62c in the X direction. The fourth return groove 62f is formed between the second supply groove 62b and the second return groove 62d in the X direction. In this configuration, the third return groove 62e, the first return groove 62c, the fourth return groove 62f and the second return groove 62d are arranged between the first supply groove 62a and the second supply groove 62b in the X direction. Therefore, the first supply groove 62a and the second supply groove 62b are spaced apart from each other by a large distance. Accordingly, the heat exchange between the first heat transfer medium and the second heat transfer medium through the shaft body 62 is suppressed. As a result, the temperature variation of the first heat transfer medium and that of the second heat transfer medium are further suppressed.

In one embodiment, as shown in FIGS. 9 and 11, the supply system 50 further includes a first member 70 and a second member 72. The first member 70 has the first supply line PL1 and the first return line RL1. The first member 70 has a substantially rectangular parallelepiped box shape and extends in the Y direction. In the first member 70, the first supply line PL1 and the first return line RL1 extend in the Y direction. The second member 72 has the second supply line PL2 and the second return line RL2. The second member 72 has a substantially parallelepiped box shape and extends in the Y direction. In the second member 72, the second supply line PL2 and the second return line RL2 extend in the Y direction.

The first member 70 and the second member 72 are arranged along the X direction. One ends of the first member 70 and the second member 72 are fixed to a manifold 74. The other ends of the first member 70 and the second member 72 are fixed to a fixing member 75. The manifold 74 has connection parts 74a to 74d.

The connection part 74a is connected to the supply port 52a of the first medium temperature controller 52 through a line. The supply port 52a of the first medium temperature controller 52 is connected to the first supply line PL1 through the corresponding line, a flow path in the connection part 74a and a flow path in the manifold 74. The connection part 74b is connected to the return port 52b of the first medium temperature controller 52 through a line. The return port 52b of the first medium temperature controller 52 is connected to the first return line RL1 through the corresponding line, a flow path in the connection part 74b and the flow path in the manifold 74. The connection part 74c is connected to the supply port 54a of the second medium temperature controller 54 through a line. The supply port 54a of the second medium temperature controller 54 is connected to the second supply line PL2 through the corresponding line, a flow path in the connection part 74c and the flow path in the manifold 74. The connection part 74d is connected to the return port 54b of the second medium temperature controller 54 through a line. The return port 54*b* of the second medium temperature controller 54 is connected to the second return line RL2 through the corresponding line, a flow path in the connection part 74*d* and the flow path in the manifold 74.

As shown in FIGS. 9 and 11, the first member 70 and the second member 72 are spaced apart from each other with a gap therebetween. With this configuration, the heat exchange between the first member 70 and the second member 72 is suppressed. Therefore, the temperature variation of the first heat transfer medium and the temperature variation of the second heat transfer medium are suppressed.

A plurality of valve units VU is mounted on the first member 70 and the second member 72. The valve units VU are provided on the first member 70 and the second member 72 such that the central axes AX of the shaft bodies 62 thereof extend in the X direction. With this configuration, the first member 70, the second member 72 and the valve units VU are arranged compactly.

In one embodiment, the first return line RL1 and the second return line RL2 are provided between the first supply line PL1 and the second supply line PL2 in the X direction. With this configuration, the first supply line PL1 and the second supply line PL2 are spaced apart from each other by a large distance. Therefore, the temperature variation of the first heat transfer medium and the temperature variation of the second heat transfer medium are suppressed.

In one embodiment, the first inlet 60*d* and the first supply line PL1 of the valve units VU are arranged along the Z direction. The Z direction is a third direction perpendicular to the X direction and the Y direction. The third outlet 60*i* and the first return line RL1 are arranged along the Z direction. The second inlet 60*e* and the second supply line PL2 are arranged along the Z direction. The fourth outlet 60*j* and the second return line RL2 are arranged along the Z direction.

The first member 70 and the second member 72 are provided with a plurality of connecting lines CL. The connecting lines extend in the Z direction. The connecting lines CL allow the connection between the first inlet 60*d* and the first supply line PL1, the connection between the third outlet 60*i* and the first return line RL1, the connection between the second inlet 60*e* and the second supply line PL2, and the connection between the fourth outlet 60*j* and the second return line RL2.

In one embodiment, as shown in FIGS. 8 and 10, the supply system 50 further includes a plurality of joints 76 and a plurality of fifth supply lines PL5. Each of the joints 76 has two input ports 76*a* and 76*b* and one output port 76*c*. In each of the joints 76, the input ports 76*a* and 76*b* communicate with the output port 76*c*. The input ports 76*a* and 76*b* of each joint 76 are connected to a third supply line PL3 and a fourth supply line PL4 connected to a corresponding valve unit VU. The output port 76*c* of the joints 76 is connected to the fifth supply lines PL5. In one embodiment, the fifth supply lines PL5 are configured as a plurality of lines. The fifth supply lines PL5 are respectively inserted into the first openings 141*a*, 141*b*, 141*c*, 141*d* and 141*e* of the case 14. The fifth supply lines PL5 are respectively connected to the second ends 181*a*2, 181*b*2, 181*c*2, 181*d*2 and 181*e*2 of the flow path unit 18.

In one embodiment, the flow path length of the third supply line PL3 and the flow path length of the fourth supply line PL4 are longer than the flow path length of the fifth supply line PL5. With this configuration, the first heat transfer medium and the second heat transfer medium can be supplied to the vicinity of the stage ST by using individual supply lines. Therefore, the temperature variation of the first heat transfer medium and the temperature variation of the second heat transfer medium are suppressed.

Figure 15:
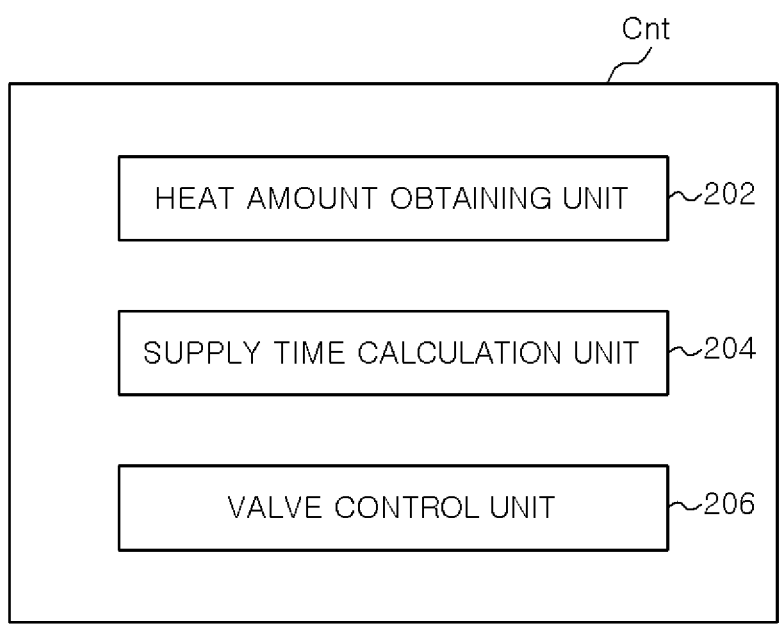
FIG. 15 shows a configuration of a control unit according to an embodiment.

Hereinafter, the configuration of the control unit Cnt which is related to the control of the valve units VU will be described. FIG. 15 shows the configuration of the control unit according to the embodiment. As shown in FIG. 15, the control unit Cnt includes a heat amount obtaining unit 202, a supply time calculation unit 204 and a valve control unit 206. The heat amount obtaining unit 202 is a functional element for obtaining the amount of heat required to set a temperature of each zone of the stage ST to a target temperature. The supply time calculation unit 204 is a functional element for calculating the supply time of the first heat transfer medium and the supply time of the second heat transfer medium which are alternately supplied to each zone of the stage ST based on the heat amount obtained by the heat amount obtaining unit 202. The valve control unit 206 is a functional element for controlling the driving units 64 of the valve units VU such that the first heat transfer medium and the second heat transfer medium can be alternately supplied to each zone of the stage ST.

Figure 16:
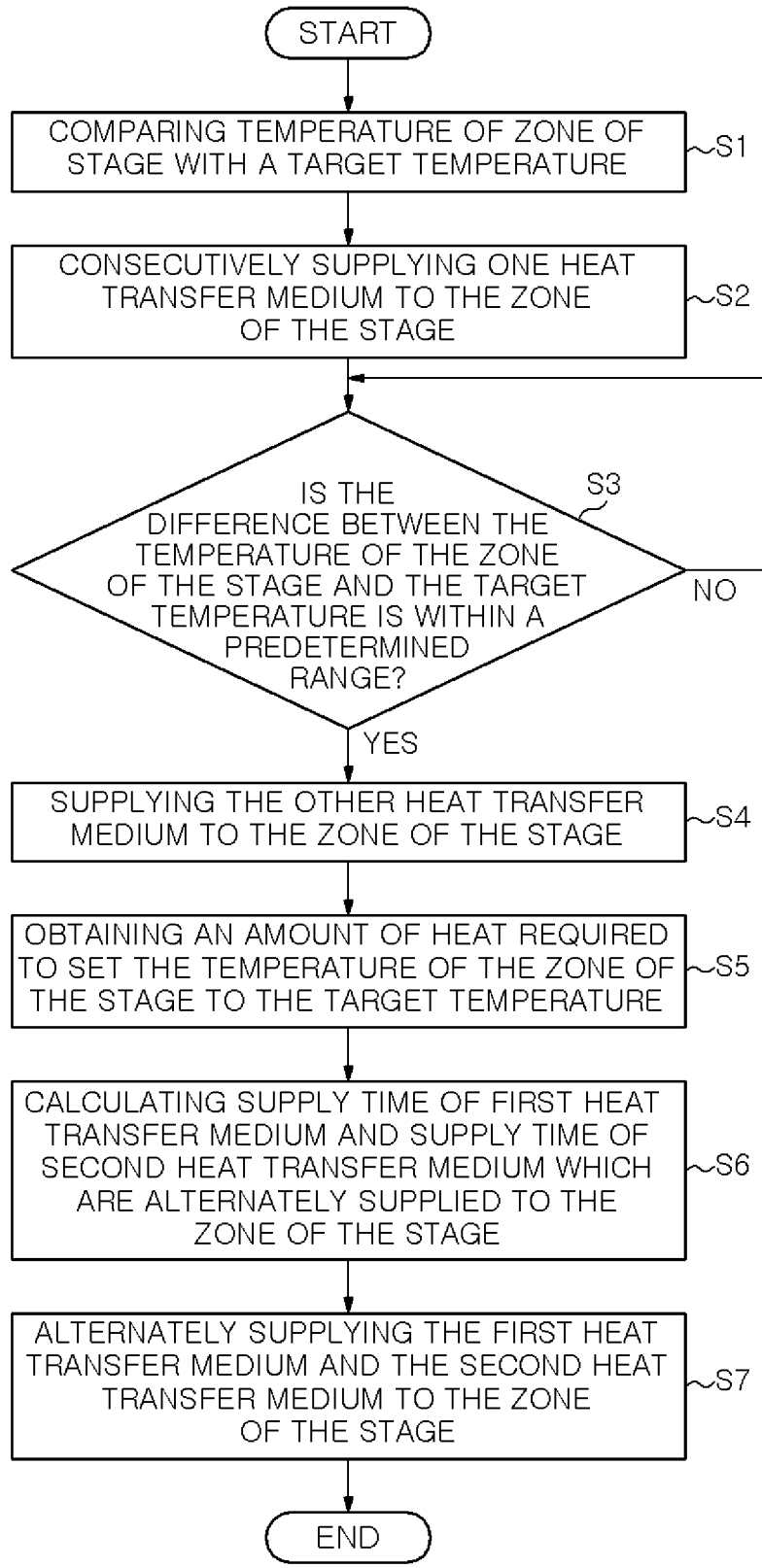
FIG. 16 is a flowchart showing a temperature control method according to an embodiment.

FIG. 16 is a flowchart of a temperature control method according to an embodiment. Hereinafter, the control operation of the control unit Cnt as well as the temperature control method of the stage ST will be described with reference to FIG. 16. The temperature control method to be described below is performed for each zone of the stage ST. In the following description, the temperature control for one of the zones of the stage ST will be described.

In the temperature control method, the control unit Cnt uses a measurement value of the temperature sensor TS. The temperature sensor TS measures a temperature of the heat transfer medium flowing through the third return line RL3 and outputs the measured temperature.

First, a step S1 of the temperature control method is executed. In the step S1, the control unit Cnt obtains a temperature of a zone of the stage ST from the measurement value of the temperature sensor TS and compares the temperature of the zone of the stage ST with a target temperature. The control unit Cnt can calculate the amount of heat lost in the zone of the stage ST from the difference between the temperature of the heat transfer medium supplied to the zone of the stage ST and the measurement value of the temperature sensor TS and obtain the temperature of the zone of the stage ST based on the calculated heat amount. The target temperature is obtained from the control recipe stored in the storage unit of the control unit Cnt.

Next, in a step S2, the valve control unit 206 controls the driving unit 64 of the corresponding valve unit VU such that one of the first heat transfer medium and the second heat transfer medium can be consecutively supplied to the zone of the stage ST. The corresponding heat transfer medium is selected between the first heat transfer medium and the second heat transfer medium in order to make the temperature of the stage ST close to the target temperature. Next, in a step S3, the control unit Cnt determines whether or not the difference between the temperature of the zone of the stage ST and the target temperature is within a predetermined range. When the difference between the temperature of the zone of the stage ST and the target temperature is not within the predetermined range, the step S2 is continued and the determination process in the step S3 is repeated until the difference between the temperature of the zone of the stage ST and the target temperature becomes within the predetermined temperature. On the other hand, when it is determined in the step S3 that the difference between the temperature of the zone of the stage ST and the target temperature is within the predetermined range, a step S4 is executed.

In the step S4, the valve control unit 206 controls the driving unit 64 of the corresponding valve unit VU such that the other one of the first heat transfer medium and the second heat transfer medium which is different from the heat transfer medium supplied in the step S2 can be supplied to the zone of the stage ST.

Next, in a step S5, the heat amount obtaining unit 202 obtains the amount of heat required to set the temperature of the zone of the stage ST to the target temperature. In one embodiment, a table showing correlation between the target temperature of the zone of the stage ST and the amount of heat required to set the temperature of the zone to the target temperature is previously stored in the storage unit of the control unit Cnt. The heat amount obtaining unit 202 obtains the amount of heat required to set the temperature of the zone of the stage ST to the target temperature while referring to the corresponding table stored in the storage unit.

Next, in a step S6, the supply time calculation unit 204 calculates the supply time of the first heat transfer medium and the supply time of the second heat transfer medium which are alternately supplied to the zone of the stage ST based on the required heat amount obtained by the heat amount obtaining unit 202. Specifically, the supply time calculation unit 204 calculates the amount of the first heat transfer medium and the amount of the second heat transfer medium which are to be supplied to the corresponding zone during one cycle of alternately supplying the first heat transfer medium and the second heat transfer medium to apply the required heat amount obtained by the heat amount obtaining unit 202 to the zone of the stage ST. The heat amount obtaining unit 202 calculates the supply time of the first heat transfer medium and the supply time of the second heat transfer medium per one cycle from the calculated amount of the first heat transfer medium and the calculated amount of the second heat transfer medium.

Next, in a step S7, the valve control unit 206 controls the driving unit 64 of the corresponding valve unit VU such that the first heat transfer medium and the second heat transfer medium can be alternately supplied to the zones of the stage ST during the supply time calculated by the supply time calculation unit 204. In other words, the rotation speed of the shaft body 62 of the valve unit VU is controlled. Accordingly, the temperature of the zone of the stage ST is stably maintained at the target temperature.

While the various embodiments have been described, the present disclosure may be variously modified without being limited to the above-described embodiments. In the above-described embodiments, the substrate processing apparatus is a capacitively coupled plasma processing apparatus. However, the substrate processing apparatus may be a plasma processing apparatus using another plasma source, such as an inductively coupled plasma processing apparatus, a plasma processing apparatus using surface waves, e.g., microwaves, or the like. Further, the substrate processing apparatus may be a substrate processing apparatus other than the plasma processing apparatus.

In the substrate processing apparatus of the above-described embodiments, the stage ST has five zones. However, the number of the zones of the stage ST may be one or more without being limited to five. The number of the valve units VU, the number of the third supply lines PL3, the number of the fourth supply lines PL4, the number of the fifth supply lines PL5, the number of the third return lines RL3 and the like in the supply system 50 are set to be equal to the number of the zones of the stage ST. When the stage ST has a plurality of zones, these zones may include a plurality of zones specified by partitioning one or more regions, among a plurality of regions coaxially arranged about the central axis of the stage, in a circumferential direction.

Figure 17:
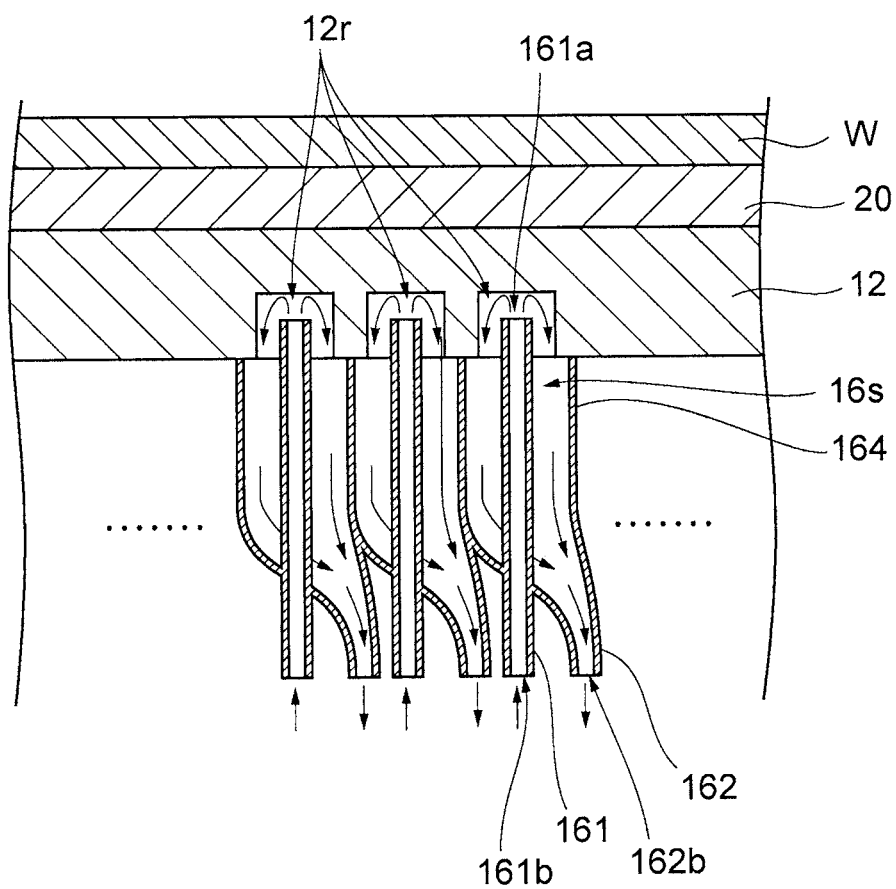
FIG. 17 is a cross sectional diagram showing another example of the heat exchanger and a plate.

As shown in FIG. 17, the bottom surface 12b of the plate 12 may have a plurality of recesses 12r communicating with the spaces 16s provided by the heat exchanger 16. The first opening ends 161a of the first tubes 161 may be disposed in the recesses 12r.

While the disclosure has been shown and described with respect to the embodiments, it will be understood by those skilled in the art that various changes and modifications may be made without departing from the scope of the disclosure as defined in the following claims.

What is claimed is:

1. A supply system for alternately supplying a first heat transfer medium and a second heat transfer medium, the supply system being capable of being connected to one or more zones of a stage configured to support a substrate, a temperature of the first heat transfer medium being different from a temperature of the second heat transfer medium, the system comprising:

one or more valve units each of which is configured to alternately supply the first heat transfer medium and the second heat transfer medium to a corresponding zone among the one or more zones, a first supply line configured to supply the first heat transfer medium to the valve units;

a second supply line configured to supply the second heat transfer medium to the valve units;

one or more third supply lines configured to feed the first heat transfer medium from the first supply line through the valve units to the one or more zones, respectively;

one or more fourth supply lines configured to feed the second heat transfer medium from the second supply line through the valve units to the one or more zones, respectively, a first return line configured to feed a heat transfer medium returning from said one or more zones;

a second return line configured to feed the heat transfer medium returning from the one or more zones; and one or more third return lines configured to feed the heat transfer medium returning from the one or more zones, wherein each of said one or more valve units includes:

a tubular housing having a first inlet, a second inlet, a first outlet and a second outlet, the first inlet being connected to the first supply line, the second inlet being connected to the second supply line, the first outlet being connected to one of said one or more third supply lines configured to feed the first heat transfer medium to the corresponding zone, the second outlet being connected to one of said one or more fourth supply lines configured to feed the second heat transfer medium to the corresponding zone;

a shaft body inserted in the housing and having a first supply groove and a second supply groove which extend along a circumferential direction around a central axis of the shaft body, the first supply groove connecting the first inlet to the first outlet when a rotation angle about the central axis of the shaft body is within a first angle range and the second supply groove connecting the second inlet to the second outlet when the rotation angle about the central axis of the shaft body is within a second angle range; and a driving unit configured to rotate the shaft body about the central axis, wherein the first inlet and the second inlet are arranged in parallel to the central axis of the shaft body, wherein the housing further has a third inlet, a third outlet and a fourth outlet, the third inlet being connected to one of said one or more third return lines which feeds the heat transfer medium returning from the corresponding zone, the third outlet being connected to the first return line, the fourth outlet being connected to the second return line, the shaft body is further provided with a first return groove and a second return groove formed along the circumferential direction, the first return groove connecting the third inlet to the third outlet when a rotation angle about the central axis of the shaft body is within the first angle range and the second return groove connecting the third inlet to the fourth outlet when the rotation angle about the central axis of the shaft body is within the second angle range, and the shaft body is further provided with a third return groove and a fourth return groove, the third return groove connecting the first inlet to the third outlet when the rotation angle about the central axis of the shaft body is within the second angle range and the fourth return groove connecting the second inlet to the fourth outlet when the rotation angle about the central axis of the shaft body is within the first angle range.

2. The supply system of claim 1, further comprising:
one or more joints, each having two input ports and one output port communicating with the two input ports; and
one or more fifth supply lines each of which is configured to feed a heat transfer medium between an output port of one of said one or more joints and the corresponding zone,
wherein the two input ports of each of said one or more joints are respectively connected to one of said one or more third supply lines which feeds the first heat transfer medium to the corresponding zone and to one of said one or more fourth supply lines which feeds the second heat transfer medium to the corresponding zone, and
flow path lengths of said one or more third supply lines and flow path lengths of said one or more fourth supply lines are longer than flow path lengths of said one or more fifth supply lines.

3. The supply system of claim 1, wherein a gap is formed between the housing and the shaft body, and
each of said one or more valve units further includes a sealing member provided between the housing and the shaft body to seal a space in the housing.

4. The supply system of claim 1, wherein the first return groove and the second return groove are formed between the first supply groove and the second supply groove in an extension direction of the central axis.

5. The supply system of claim 1, wherein the third return groove is formed between the first supply groove and the first return groove in an extension direction of the central axis and the fourth return groove is formed between the second supply groove and the second return groove in the extension direction of the central axis.

6. The supply system of claim 1, wherein the first outlet and the second outlet are formed at a portion of the housing opposite to a portion where the first inlet and the second inlet are formed.

7. The supply system of claim 1, wherein the supply system is configured to alternately supply the first heat transfer medium and the second heat transfer medium to a plurality of zones of the stage as the one or more zones, said one or more third supply lines are a plurality of third supply lines configured to feed the first heat transfer medium from the first supply line to the respective zones, said one or more fourth supply lines are a plurality of fourth supply lines configured to feed the second heat transfer medium from the second supply line to the respective zones, said one or more third return lines are a plurality of third return lines configured to feed the heat transfer medium returning from the respective zones, and said one or more valve units are a plurality of valve units.

8. The supply system of claim 7, further comprising:
a first member having the first supply line and the first return line; and
a second member having the second supply line and the second return line,
wherein the first member and the second member are spaced apart from each other.

9. A supply system for alternately supplying a first heat transfer medium and a second heat transfer medium, the supply system being capable of being connected to one or more zones of a stage configured to support a substrate, a temperature of the first heat transfer medium being different from a temperature of the second heat transfer medium, the system comprising:

one or more valve units each of which is configured to alternately supply the first heat transfer medium and the second heat transfer medium to a corresponding zone among the one or more zones, a first supply line configured to supply the first heat transfer medium to the valve units;

a second supply line configured to supply the second heat transfer medium to the valve units;

one or more third supply lines configured to feed the first heat transfer medium from the first supply line through the valve units to the one or more zones, respectively;

one or more fourth supply lines configured to feed the second heat transfer medium from the second supply line through the valve units to the one or more zones, respectively, a first return line configured to feed a heat transfer medium returning from said one or more zones;

a second return line configured to feed the heat transfer medium returning from the one or more zones;

one or more third return lines configured to feed the heat transfer medium returning from the one or more zones;

a first member having the first supply line and the first return line; and a second member having the second supply line and the second return line, wherein each of said one or more valve units includes:
a tubular housing having a first inlet, a second inlet, a first outlet and a second outlet, the first inlet being connected to the first supply line, the second inlet being connected to the second supply line, the first outlet being connected to one of said one or more third supply lines configured to feed the first heat transfer medium to the corresponding zone, the second outlet being connected to one of said one or more fourth supply lines configured to feed the second heat transfer medium to the corresponding zone;

a shaft body inserted in the housing and having a first supply groove and a second supply groove which extend along a circumferential direction around a central axis of the shaft body, the first supply groove connecting the first inlet to the first outlet when a rotation angle about the central axis of the shaft body is within a first angle range and the second supply groove connecting the second inlet to the second outlet when the rotation angle about the central axis of the shaft body is within a second angle range; and a driving unit configured to rotate the shaft body about the central axis, wherein the first inlet and the second inlet are arranged in parallel to the central axis of the shaft body, wherein the housing further has a third inlet, a third outlet and a fourth outlet, the third inlet being connected to one of said one or more third return lines which feeds the heat transfer medium returning from the corresponding zone, the third outlet being connected to the first return line, the fourth outlet being connected to the second return line, the shaft body is further provided with a first return groove and a second return groove formed along the circumferential direction, the first return groove connecting the third inlet to the third outlet when a rotation angle about the central axis of the shaft body is within the first angle range and the second return groove connecting the third inlet to the fourth outlet when the rotation angle about the central axis of the shaft body is within the second angle range, the supply system is configured to alternately supply the first heat transfer medium and the second heat transfer medium to a plurality of zones of the stage as the one or more zones, said one or more third supply lines are a plurality of third supply lines configured to feed the first heat transfer medium from the first supply line to the respective zones, said one or more fourth supply lines are a plurality of fourth supply lines configured to feed the second heat transfer medium from the second supply line to the respective zones, said one or more third return lines are a plurality of third return lines configured to feed the heat transfer medium returning from the respective zones, said one or more valve units are a plurality of valve units, the first member and the second member are spaced apart from each other, the first member extends in a first direction such that the first supply line and the first return line extend in the first direction, the second member extends in the first direction such that the second supply line and the second return line extend in the first direction, the first member and the second member are arranged along a second direction perpendicular to the first direction, and the respective valve units are provided on the first member and the second member such that shaft bodies of the respective valve units extend in the second direction.

10. The supply system of claim 9, wherein the first return line and the second return line are provided between the first supply line and the second supply line.

11. The supply system of claim 9, wherein the first inlet and the first supply line are arranged along a third direction perpendicular to the first direction and the second direction; the third outlet and the first return line are arranged along the third direction; the second inlet and the second supply line are arranged along the third direction; and the fourth outlet and the second return line are arranged along the third direction.

12. The supply system of claim 11, wherein the first member and the second member are provided with a plurality of connection lines extending in the third direction and allowing connection between the first inlet and the first supply line, connection between the third outlet and the first return line, connection between the second inlet and the second supply line, and connection between the fourth outlet and the second return line.

13. A substrate processing apparatus for processing a substrate, comprising:

a chamber main body;

a stage provided in the chamber main body and configured to hold a substrate, the stage having one or more zones; and the supply system, described in claim 1, configured to alternately supply the first heat transfer medium and the second heat transfer medium to the one or more zones.

14. A substrate processing apparatus for processing a substrate, comprising:

a chamber main body;

a stage provided in the chamber main body and configured to hold a substrate, the stage having a plurality of zones; and the supply system, described in claim 7, configured to alternately supply the first heat transfer medium and the second heat transfer medium to the plurality of zones.

* * * * *